(12) United States Patent
Sun et al.

(10) Patent No.: US 6,937,063 B1
(45) Date of Patent: *Aug. 30, 2005

(54) METHOD AND APPARATUS OF MEMORY CLEARING WITH MONITORING RAM MEMORY CELLS IN A FIELD PROGRAMMABLE GATED ARRAY

(75) Inventors: Chung Sun, San Jose, CA (US); Eddy C. Huang, San Jose, CA (US)

(73) Assignee: Actel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/829,596

(22) Filed: Apr. 21, 2004

Related U.S. Application Data

(63) Continuation of application No. 10/366,961, filed on Feb. 12, 2003, now abandoned, which is a continuation of application No. 10/077,188, filed on Feb. 15, 2002, now Pat. No. 6,531,891, which is a continuation-in-part of application No. 09/654,240, filed on Sep. 2, 2000, now Pat. No. 6,476,636.

(51) Int. Cl.$^7$ .......................................... H03K 19/177
(52) U.S. Cl. ..................... 326/39; 326/38; 365/185.29; 365/185.11; 365/185.05
(58) Field of Search ............... 326/38–41; 365/185.05, 365/185.11, 185.29, 230.06

(56) References Cited

U.S. PATENT DOCUMENTS

| | | | |
|---|---|---|---|
| 4,750,155 A | 6/1988 | Hsieh | 365/203 |
| 4,908,528 A | 3/1990 | Huang | 307/443 |
| 5,469,003 A | 11/1995 | Kean | 326/39 |
| 5,475,830 A | 12/1995 | Chen et al. | 395/500 |
| 5,483,178 A | 1/1996 | Costello et al. | 326/41 |
| 5,485,103 A | 1/1996 | Pedersen et al. | 326/41 |
| 5,491,353 A | 2/1996 | Kean | 257/208 |
| 5,504,439 A | 4/1996 | Tavana | 326/38 |
| 5,521,529 A | 5/1996 | Agrawal et al. | 326/41 |
| 5,528,176 A | 6/1996 | Kean | 326/105 |
| 5,537,057 A | 7/1996 | Leong et al. | 326/41 |

(Continued)

FOREIGN PATENT DOCUMENTS

| | | | | |
|---|---|---|---|---|
| EP | 0 415 542 A2 | 3/1991 | | H03K 19/173 |
| EP | 0 415 542 A3 | 3/1991 | | H03K 19/173 |
| GB | 2 346 240 A | 2/2000 | | H03K 19/177 |

*Primary Examiner*—Vibol Tan
(74) *Attorney, Agent, or Firm*—Sierra Patent Group, Ltd.

(57) ABSTRACT

A field-programmable gate array (FPGA) having an array of RAM memory cells comprising at least one row of RAM memory cells, each RAM cell of the at least one row of RAM memory cells coupled to a row driver line; a row decoder coupled to a first end of the row driver line of each at least one row of RAM memory cells. A monitoring memory cell is coupled to a row driver line. Each monitoring memory cell is also coupled to a memory writing line. An FPGA also has RAM memory cells that act as the programming mechanism. The FPGA further has erase circuitry for clearing the RAM memory cells for reprogramming of the FPGA. The FPGA is erased by providing at least one monitoring memory cell coupled to the erase circuitry. A memory clear phase is initiated on at least one monitoring memory cell. The monitoring memory cell then indicts the cell has been cleared.

15 Claims, 23 Drawing Sheets

U.S. PATENT DOCUMENTS

| | | | | |
|---|---|---|---|---|
| 5,541,530 | A | 7/1996 | Cliff et al. | 326/41 |
| 5,566,123 | A | 10/1996 | Freidin et al. | 362/230.05 |
| 5,570,041 | A | 10/1996 | El Ayat et al. | 326/41 |
| 5,583,450 | A * | 12/1996 | Trimberger et al. | 326/41 |
| 5,598,109 | A | 1/1997 | Leong et al. | 326/41 |
| 5,606,266 | A | 2/1997 | Pedersen | 326/41 |
| 5,606,267 | A | 2/1997 | El Ayat et al. | 326/41 |
| 5,614,840 | A | 3/1997 | McClintock et al. | 326/41 |
| 5,617,042 | A | 4/1997 | Agrawal | 326/39 |
| 5,621,650 | A | 4/1997 | Agrawal et al. | 364/489 |
| 5,633,832 | A | 5/1997 | Patel et al. | 365/230.06 |
| 5,644,496 | A | 7/1997 | Agrawal et al. | 364/489 |
| 5,668,771 | A | 9/1997 | Cliff et al. | 365/230.03 |
| 5,671,432 | A | 9/1997 | Bertolet et al. | 395/800 |
| 5,682,107 | A | 10/1997 | Tavana et al. | 326/41 |
| 5,689,195 | A | 11/1997 | Cliff et al. | 326/41 |
| 5,694,056 | A | 12/1997 | Mahoney et al. | 326/38 |
| 5,744,995 | A | 4/1998 | Young | 327/407 |
| 5,761,099 | A | 6/1998 | Pedersen | 364/716.01 |
| 5,764,583 | A | 6/1998 | Cliff et al. | 365/230.03 |
| 5,768,479 | A | 6/1998 | Gadelkarim et al. | 395/50 |
| 5,773,993 | A | 6/1998 | Trimberger | 326/38 |
| 5,781,497 | A | 7/1998 | Patel et al. | 365/230.86 |
| 5,805,496 | A | 9/1998 | Batson et al. | 365/154 |
| 5,805,509 | A | 9/1998 | Leung et al. | 365/189.09 |
| 5,809,281 | A | 9/1998 | Steele et al. | 395/497.01 |
| 5,818,750 | A | 10/1998 | Manning | 365/154 |
| 5,819,304 | A * | 10/1998 | Nilsen et al. | 711/5 |
| 5,825,202 | A | 10/1998 | Tavana et al. | 326/39 |
| 5,828,229 | A | 10/1998 | Cliff et al. | 326/40 |
| 5,841,295 | A | 11/1998 | Kaviani | 326/39 |
| 5,874,834 | A | 2/1999 | New | 326/39 |
| 5,949,690 | A | 9/1999 | Lawman | 364/488 |
| 5,977,793 | A | 11/1999 | Reddy et al. | 326/41 |
| 5,982,193 | A | 11/1999 | Agrawal et al. | 326/39 |
| 6,000,843 | A * | 12/1999 | Sawada | 714/721 |
| 6,031,391 | A | 2/2000 | Couts-Martin et al. | 326/38 |
| 6,034,544 | A | 3/2000 | Agrawal et al. | 326/39 |
| 6,049,481 | A | 4/2000 | Yamasaki | 365/185.23 |
| 6,069,489 | A | 5/2000 | Iwanczuk et al. | 326/40 |
| 6,091,263 | A | 7/2000 | New et al. | 326/40 |
| 6,107,823 | A | 8/2000 | Agrawal et al. | 326/41 |
| 6,181,162 | B1 | 1/2001 | Lytle et al. | 326/41 |
| 6,195,774 | B1 | 2/2001 | Jacobson | 714/727 |
| 6,211,697 | B1 | 4/2001 | Lien et al. | 326/41 |
| 6,218,860 | B1 * | 4/2001 | Lytle et al. | 326/41 |
| 6,301,696 | B1 | 10/2001 | Lien et al. | 716/16 |
| 6,345,000 | B1 | 2/2002 | Wong et al. | 365/185.29 |
| 6,356,109 | B1 * | 3/2002 | Furuta et al. | 326/41 |
| 6,446,242 | B1 | 9/2002 | Lien et al. | 716/6 |
| 6,462,577 | B1 * | 10/2002 | Lee et al. | 326/40 |
| 6,476,636 | B1 | 11/2002 | Lien et al. | 326/41 |
| 6,501,677 | B1 * | 12/2002 | Rau et al. | 365/154 |
| 6,531,891 | B1 | 3/2003 | Sun et al. | 326/41 |

* cited by examiner

FPGA Tile 20

Fig. 1

METHOD AND APPARATUS OF MEMORY CLEARING WITH MONITORING RAM MEMORY CELLS IN A FIELD PROGRAMMABLE GATED ARRAY

CROSS-REFERENCE TO RELATED APPLICATIONS

This application is a continuation of U.S. patent application Ser. No. 10/366,961 filed Feb. 12, 2003 now abandoned which is a continuation application of U.S. patent application Ser. No. 10/077,188, filed Feb. 15, 2002, now issued as U.S. Pat. No. 6,531,891, which is a continuation-in-part of U.S. patent application Ser. No. 09/654,240, filed Sep. 2, 2000, now issued as U.S. Pat. No. 6,476,636.

BACKGROUND OF THE DISCLOSED SYSTEM

1. Field of the Disclosed System

The present disclosed system relates to field-programmable gate arrays ("FPGAs"), and more particularly, to a method and apparatus for verifying the proper operation of memory cells of an FPGA.

2. Description of the Related Art

An FPGA is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC which makes the ASIC a smaller device. An ASIC, on the other hand, is not a flexible device. In other words, once an ASIC has been designed and manufactured it cannot be reconfigured to perform a different function like is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components.

The several other components may include, for example, a microprocessor, memory, arithmetic logic unit (ALU), state machine, etc. In this scenario the embedded FPGA may be only a small part of the whole SOC.

Whether an FPGA is to be manufactured as its own IC or embedded into a larger IC (e.g., an SOC), the intended application/use of the IC will determine the size and complexity of the FPGA that is needed. In some scenarios a large FPGA is needed, and in other scenarios a small FPGA is needed. Because conventional FPGAs are typically designed for their intended application/use, an FPGA designed to fulfill a need for a small FPGA must be substantially redesigned for use where a larger FPGA is needed. Therefore, it would be highly advantageous to have an FPGA apparatus and method that could be easily adapted for use in both ICs requiring large FPGAs and ICs requiring small FPGAs. Furthermore, it would be highly advantageous if such FPGA apparatus and method could be used in both the scenario where the FPGA is to be manufactured as its own IC and the scenario where the FPGA is to be embedded into a larger IC.

BRIEF SUMMARY OF THE DISCLOSED SYSTEM

The disclosed apparatus relates to a field-programmable gate array (FPGA) comprising an array of RAM memory cells comprising at least one row of RAM memory cells, each RAM cell of the at least one row of RAM memory cells coupled to a row driver line; a row decoder coupled to a first end of the row driver line of each at least one row of RAM memory cells; a monitoring memory cell coupled to at least one of the row driver line; and where each monitoring memory cell is also coupled to a memory writing line.

The disclosed method refers to a FPGA having a plurality of RAM memory cells as the programming mechanism, the FPGA further having erase circuitry for clearing the RAM memory cells for reprogramming of the FPGA. The method comprises providing at least one monitoring memory cell coupled to the erase circuitry; initiating a memory clear phase on at least one monitoring memory cell; and making a determination as to whether the output signal from each at least one monitoring memory cell indicates a cleared monitoring memory cell. The disclosed method may further comprise an act of writing to the at least one monitoring memory cell and a query of determining whether all of the at least one monitoring cell was properly written to.

A better understanding of the features and advantages of the present disclosed system will be obtained by reference to the following detailed description of the disclosed system and accompanying drawings which set forth an illustrative embodiment in which the principles of the disclosed system are utilized.

BRIEF DESCRIPTION OF THE DRAWINGS

FIG. 1 is a block diagram illustrating an FPGA tile in accordance with the present disclosed system.

DETAILED DESCRIPTION OF THE DISCLOSED SYSTEM

Figure 1:
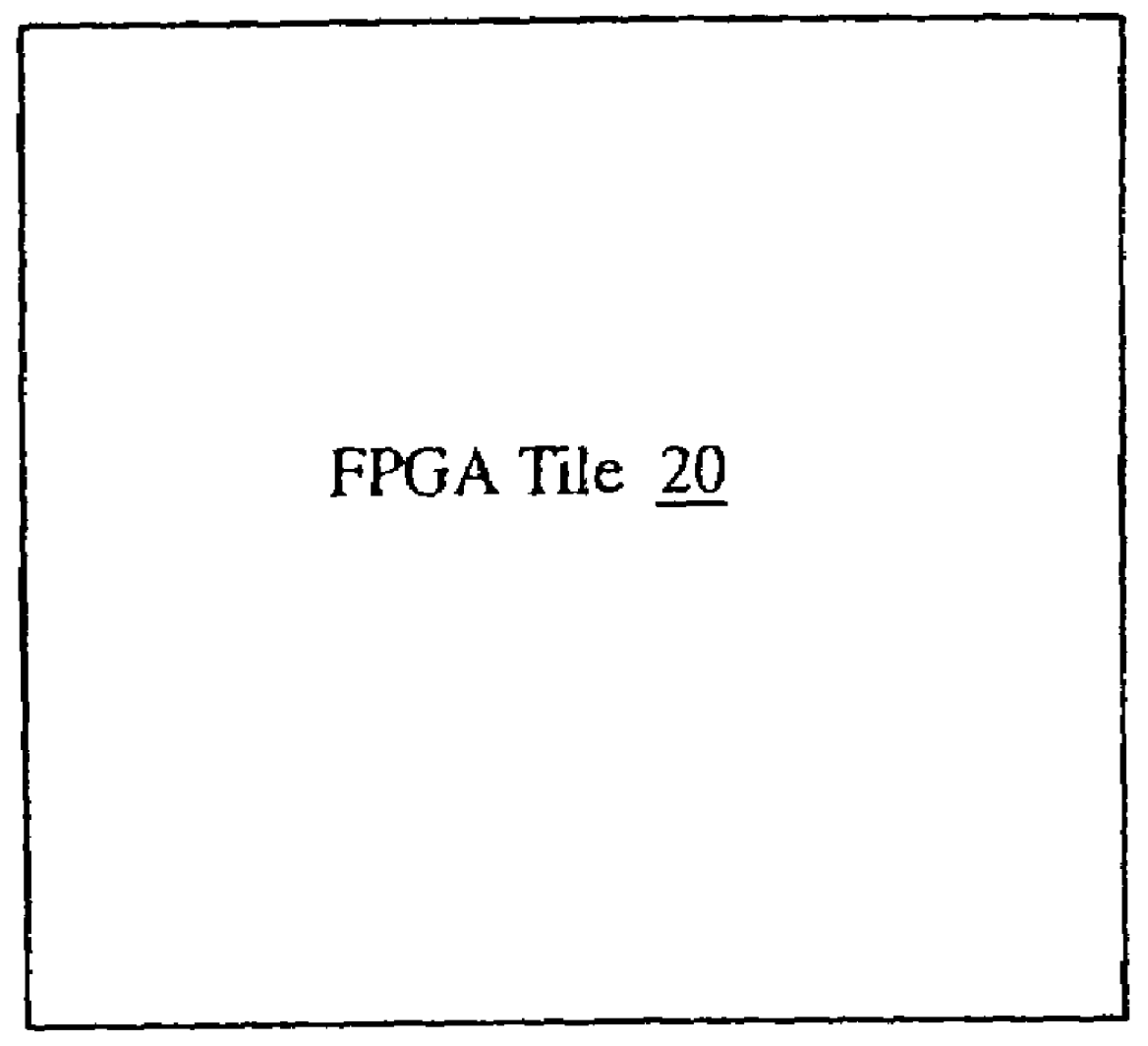

Referring to FIG. 1, there is illustrated a field-programmable gate array (FPGA) tile 20 in accordance with the present disclosed system. The FPGA tile 20 overcomes many of the disadvantages of conventional FPGAs in that it can be easily adapted for use in both integrated circuits (ICs) requiring large FPGAs and ICs requiring small FPGAs. Furthermore, the FPGA tile 20 can be used where the FPGA is to be manufactured as its own IC and where the FPGA is to be embedded into a larger IC (e.g., a system on a chip (SOC)).

Figure 2:
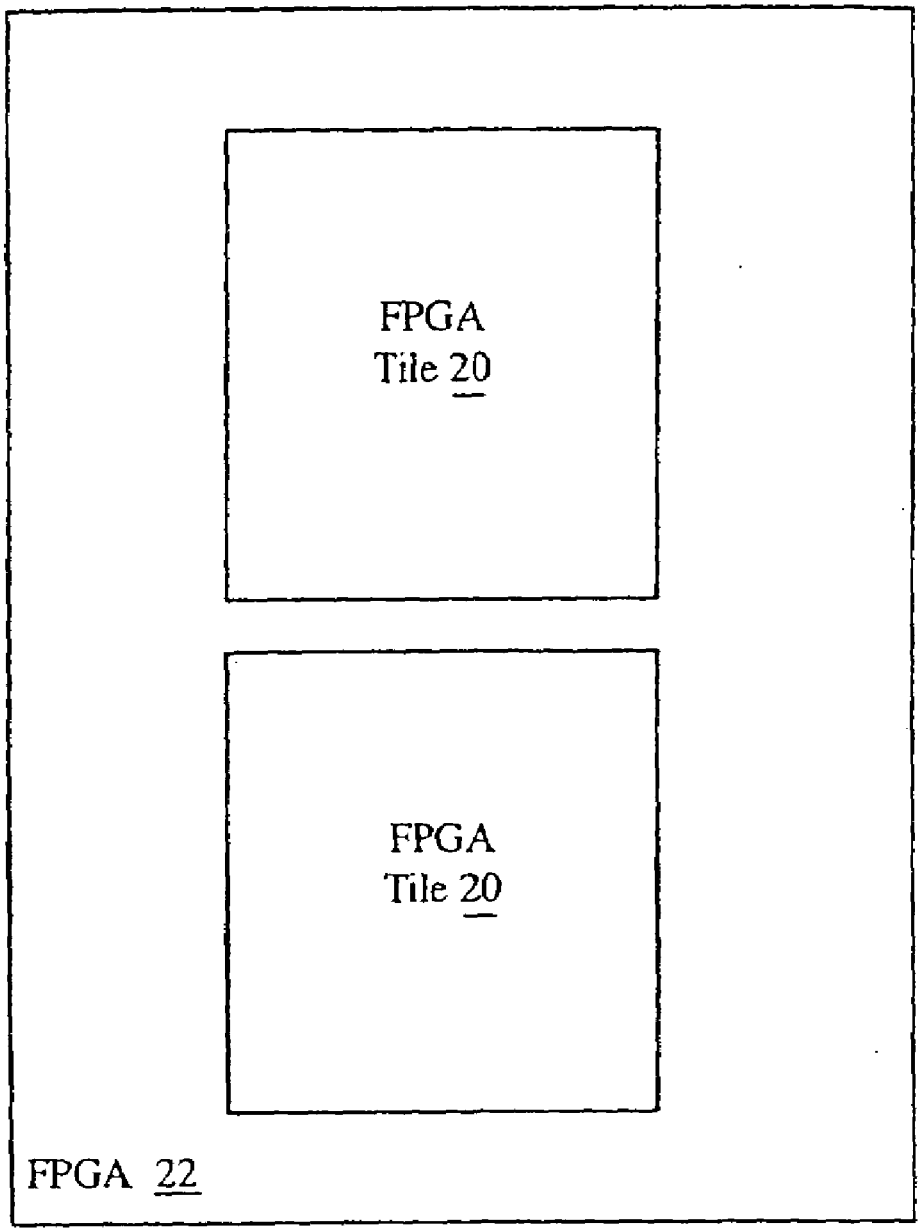
FIGS. 2, 3A, 3B and 4 are block diagrams illustrating various configurations of FPGA tiles in accordance with the present disclosed system.
Figure 3A:
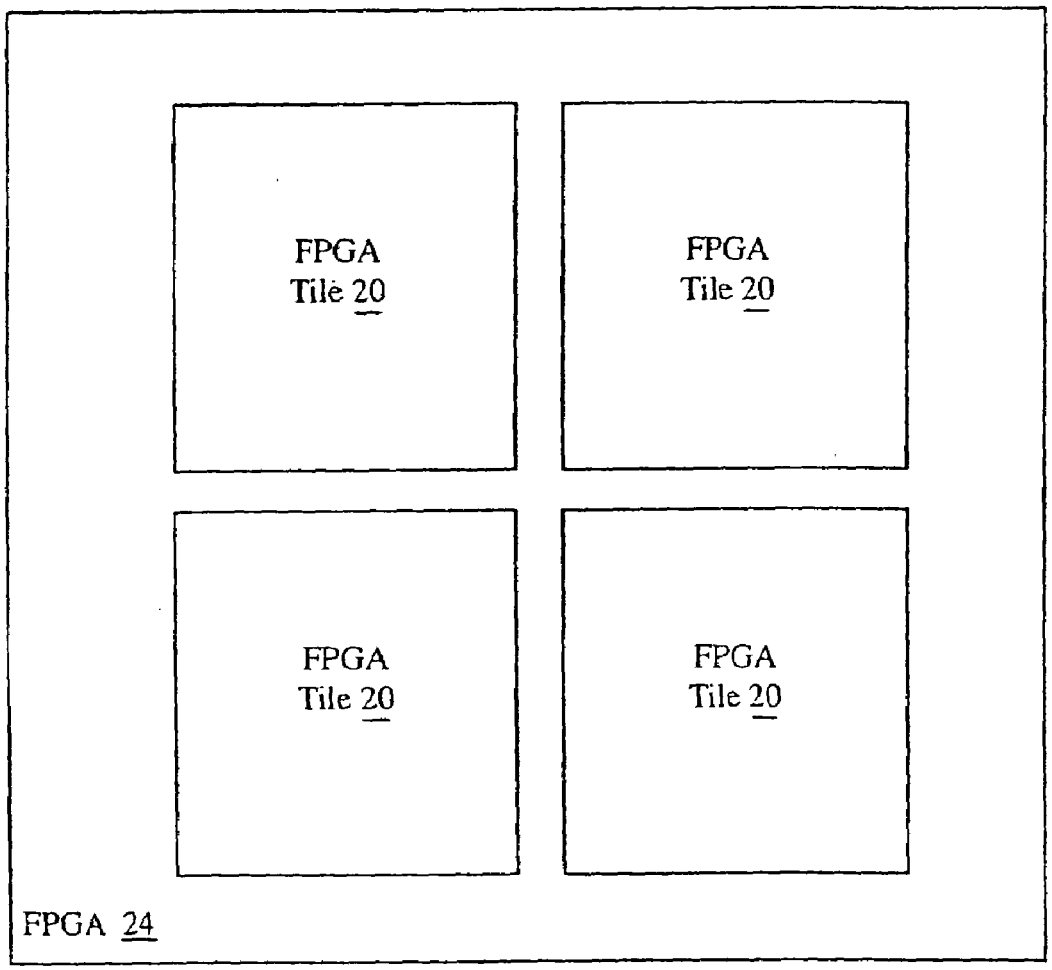

One feature of the FPGA tile 20 that makes it such a flexible and adaptable device is that it is "tileable". As used herein, the term "tileable" means that the FPGA tile 20 can be combined with other FPGA tiles to form a larger FPGA. For example, FIG. 2 illustrates an FPGA 22 that is formed by combining two FPGA tiles 20. The two FPGA tiles 20 work together and communicate with each other to form the larger FPGA 22. It should be well understood that any number of FPGA tiles 20 may be combined in accordance with the present disclosed system to form a larger FPGA. For example, FIG. 3A illustrates an FPGA 24 that is formed by combining four FPGA tiles 20.

Figure 3B:
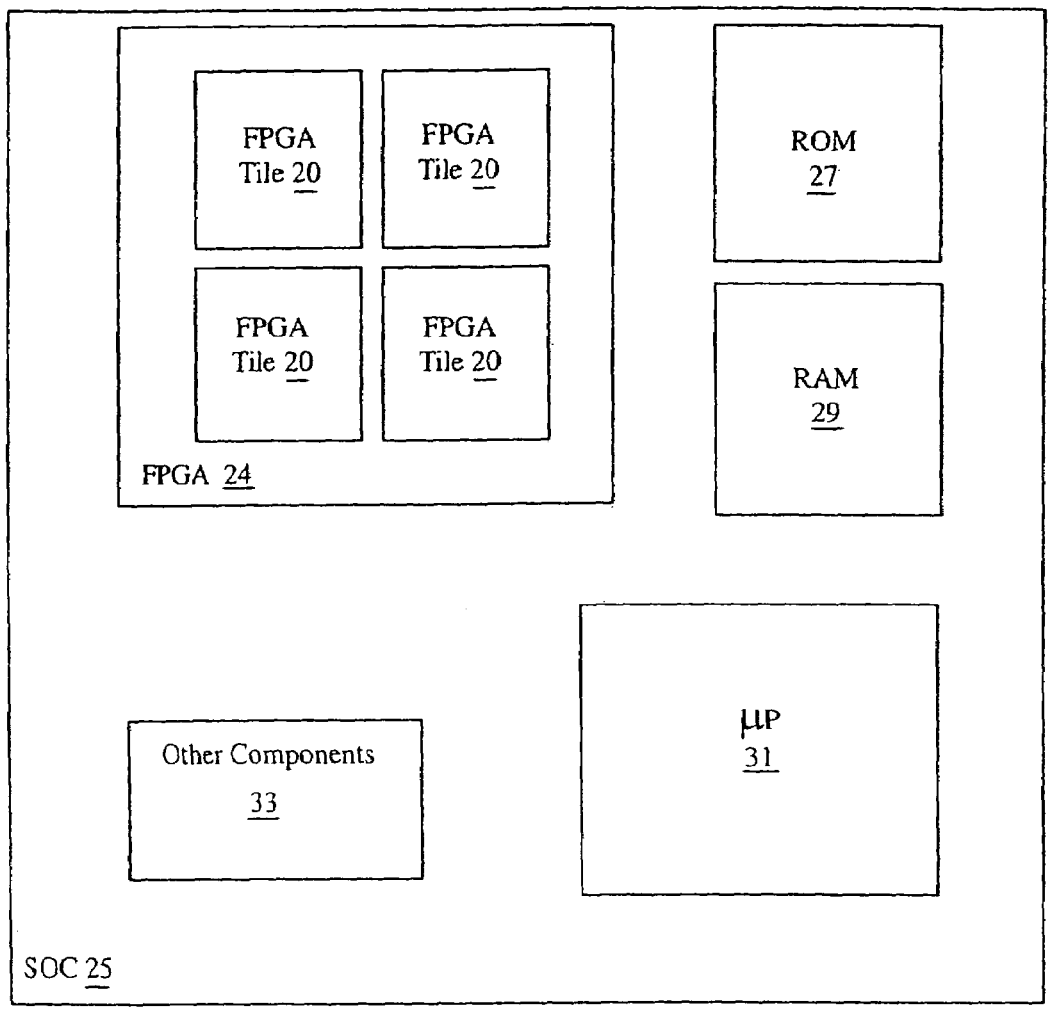
Figure 4:
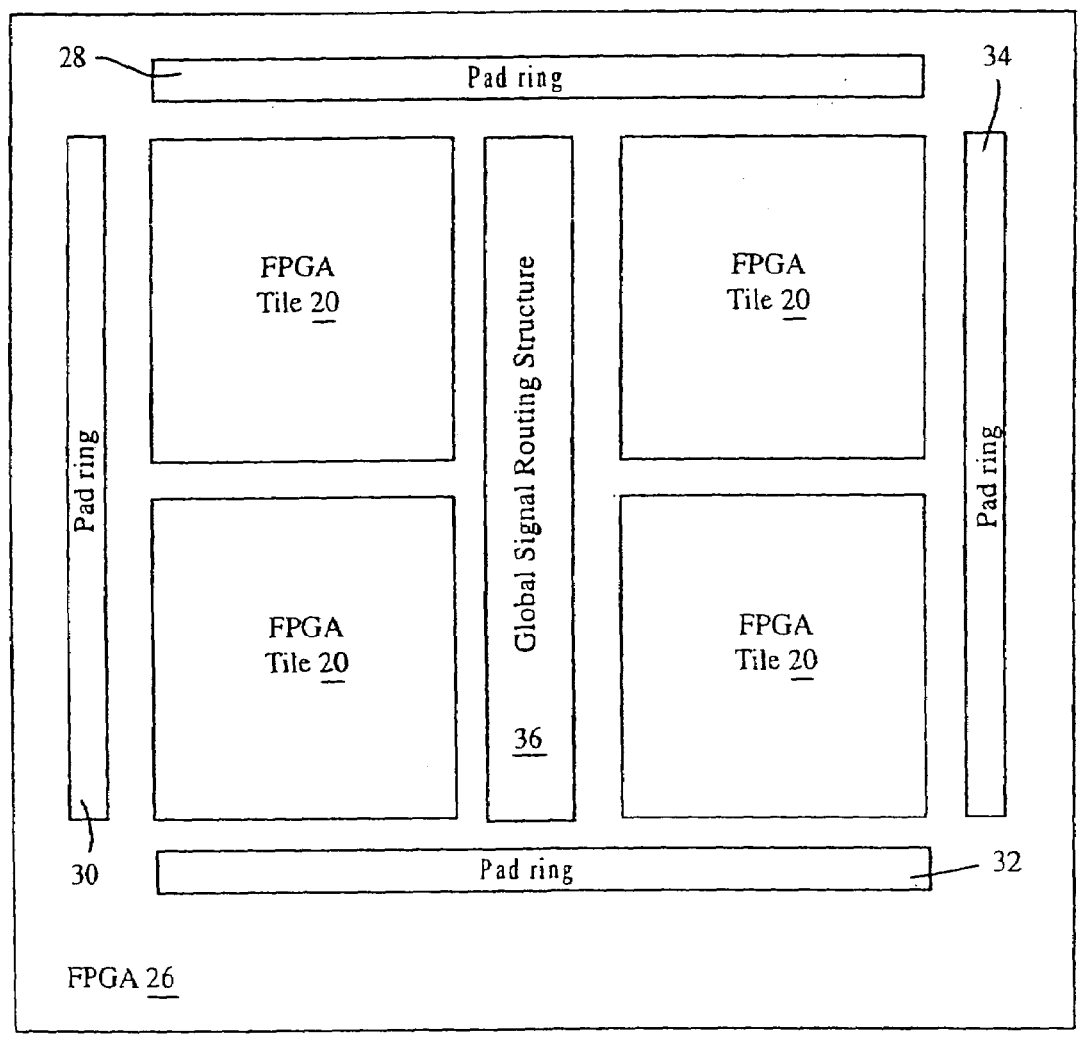

In accordance with the present disclosed system, FPGA tiles 20 may be combined to form a larger FPGA that is to be manufactured as its own IC or that is to be embedded into a larger IC. For example, with respect to the later scenario, the FPGAs 22, 24 may be embedded into SOCs. FIG. 3B shows an SOC having the FPGA 24 embedded therein. The SOC 25 includes several other components. The other components may include, for example, a read only memory (ROM) 27, a random access memory (RAM) 29, a microprocessor 31, and any other components 33. It should be well understood that the specific types of other components and the number of other components included on the SOC 25 will vary greatly depending on the particular application. With respect to the former scenario, FIG. 4 illustrates an FPGA 26 that has been manufactured as its own IC. Specifically, the FPGA 26 includes four FPGA tiles 20 and four pad rings 28, 30, 32, 34. The pad rings 28, 30, 32, 34 are used to couple the FPGA tiles 20 to the IC package pins of the FPGA 26.

Also illustrated in FIG. 4 is a global signal routing structure 36. The global signal routing structure 36 will be described in more detail below, but in general, it is used to route inter-tile global signals between the FPGA tiles 20. It should be understood that the global signal routing structure 36 may be included in any combination of FPGA tiles 20, including for example the FPGAs 22, 24, in accordance with the present disclosed system. Furthermore, the global signal routing structure 36 may be used whether the combined FPGA tiles 20 are manufactured as their own IC or embedded into a larger IC.

The FPGA tiles that are combined may be identical (as are the tiles in the FPGAs 22, 24, 26), or of different sizes and designs in accordance with the present disclosed system. An advantage of using identical FPGA tiles is that it provides an economical solution for providing FPGAs having sizes that are appropriate for the intended uses/applications. Such a solution is economical because only one FPGA tile needs to be designed, and then the necessary number of tiles are combined to form an FPGA. Additionally, it should be understood that an "FPGA tile" is considered herein to be an FPGA. In other words, a single FPGA tile 20 can be used by itself to form an FPGA.

Figure 5:
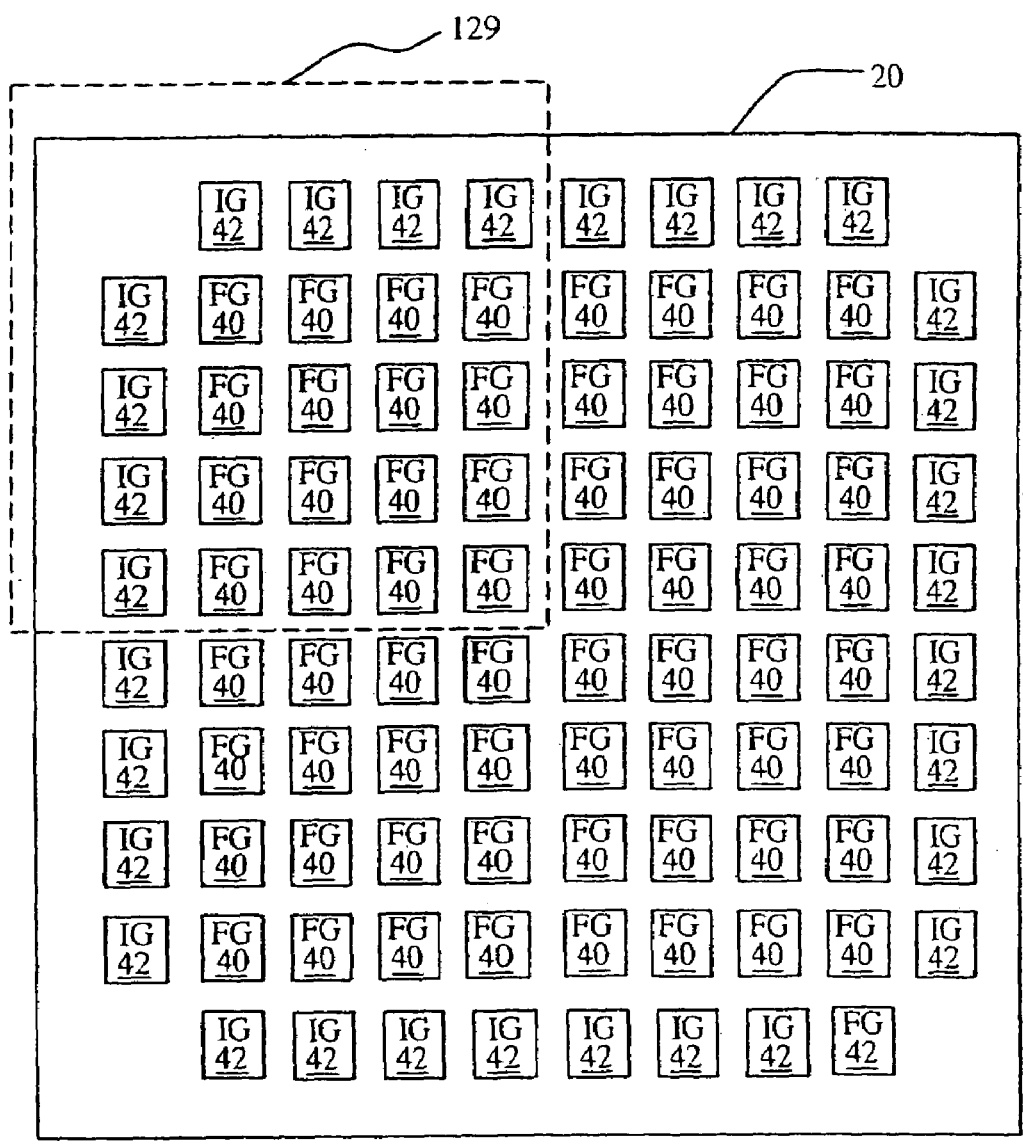
FIG. 5 is a block diagram illustrating in further detail the FPGA tile shown in FIG. 1.

Referring to FIG. 5, there is illustrated some of the internal components of the FPGA tile 20. Specifically, the FPGA tile 20 includes several functional groups (FGs) 40 that are surrounded by several interface groups (IGs) 42. The FGs 40 are small multifunction circuits that are capable of realizing many or all Boolean functions. The FGs 40 include look-up tables (LUTs) and other circuits capable of realizing Boolean functions, as well as memory cells that are used to configure logic functions such as addition, subtraction, etc. The IGs 42 are used for interfacing the FPGA tile 20 to other FPGA tiles or devices, or to pad rings for connecting the FPGA tile 20 to IC package pins. In general, the logic structure of the FPGA tile 20 is provided by the FGs 40 and the IGs 42. Also included in the FPGA tile 20, but not shown in FIG. 5, are several horizontal and vertical regular routing buses, routing interconnect areas, switching transistors, and global signal distribution, all of which will be discussed below.

Figure 6:
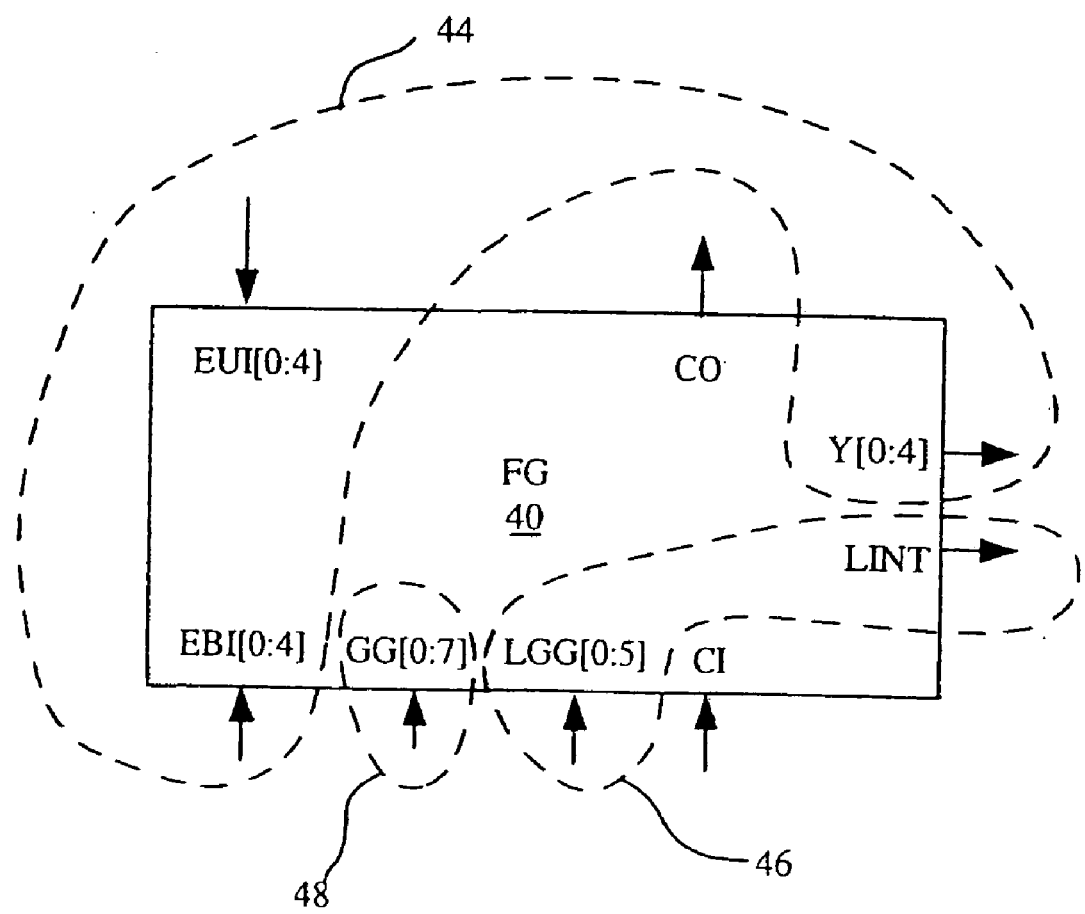
FIG. 6 is a block diagram illustrating in further detail one of the functional groups (FGs) shown in FIG. 5.

Referring to FIG. 6, an exemplary version of the FG 40 includes regular routing signals 44, intra-tile global signals 46, and inter-tile global signals 48. The regular routing signals 44 include regular input signals EUI[0:4] (upper input) and EBI[0:4] (bottom input). These signals are the basic inputs on which the Boolean functions and logic operation of the FG 40 are performed. The regular routing signals 44 also include regular output signals Y[0:4]. These signals are the basic outputs which carry the result of the Boolean functions and logic operation of the FG 40. The regular routing signals 44 are carried within the FPGA tile 20 on horizontal and vertical regular routing buses and routing interconnect areas. If any of the regular routing signals 44 are to be sent to a different FPGA tile, they are passed through an IG 42.

The intra-tile global signals 46 include input signals LGG[0:5] and output signal LINT. The LINT signal is a second routing resource. Specifically, in some situations the regular routing output signals Y[0:4] cannot be sent to the intended FG 40 because the regular routing buses and routing interconnect areas do not provide the necessary connections. Or, in other situations, it may be desirable not to use the system central processing unit (CPU) time to send a signal through the regular routing buses and routing interconnect areas. In these situations, the needed one of the regular routing output signals Y[0:4] can be selected as the LINT signal. The LINT signal is routed around the FPGA tile 20 by a routing structure that is separate from the regular routing buses and routing interconnect areas used to route the regular routing output signals Y[0:4]. Therefore, the LINT signal can be sent to any FG 40 or IG 42 regardless of whether the regular routing buses and routing interconnect areas provide the necessary connections. The LINT signals are received by the FG 40 on input signals LGG[0:5] which are part of the routing structure of the LINT signals. As its name implies, the intra-tile global signals 46 are routed within the boundaries of the FPGA tile 20 and are preferably not routed between FPGA tiles. The intra-tile global signals 46 and the generation and use of the LINT signal will be discussed in more detail below.

The inter-tile global signals 48 include the input signals GG[0:7]. These signals are sent to every FG 40 in all FPGA tiles. As will be discussed below, selected ones of the input signals GG[0:7] are used to control the clock/enable/preset/clear (C/E/P/C) inputs of flip-flops included in each FG 40.

Each FG 40 also includes a CL input and a CO output. The purpose of these signals is to implement a carry chain for faster utilization of logic resources.

Figure 7:
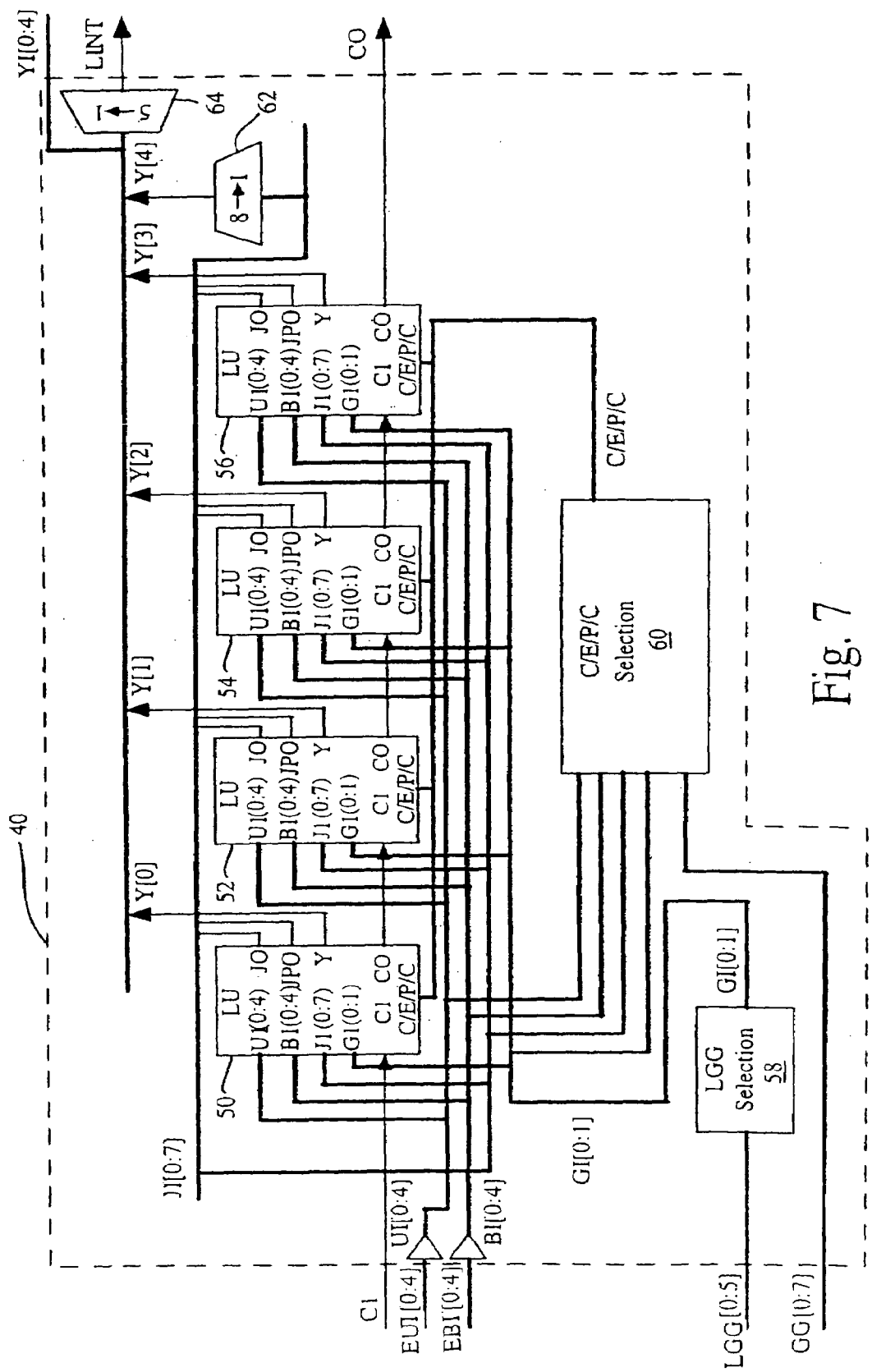
FIG. 7 is a schematic diagram illustrating in further detail the FG shown in FIG. 6.

Referring to FIG. 7, each FG 40 preferably includes four logic units (LU) 50, 52, 54, 56. The LUs 50, 52, 54, 56 provide the Boolean functions and logic operations of the FG 40. Each of the LUs 50, 52, 54, 56 includes several inputs on which Boolean functions and logic operations are performed. As shown, each of the LUs 50, 52, 54, 56 includes twenty such inputs, but it should be understood that the number of inputs may vary in accordance with the present disclosed system. Specifically, each of the LUs 50, 52, 54, 56 receives input signals UI[0:4] and BI[0:4] which correspond to regular input signals EUI[0:4] and EBI[0:4] discussed above. Furthermore, each of the LUs 50, 52, 54, 56 receives input signals GI[0:1]. The input signals GI[0:1] are generated by the LGG selection circuit 58 which selects two of the input signals LGG[0:5]. As mentioned above, the input signals LGG[0:5] carry selected ones of the LINT signals. Finally, each of the LUs 50, 52, 54, 56 receives input signals JI[0:7]. The input signals JI[0:7] include two output signals from each of the LUs 50, 52, 54, 56. Thus, two output signals of each of the LUs 50, 52, 54, 56 are fed back to the inputs by way of JI[0:7].

Each of the LUs 50, 52, 54, 56 also includes a clock/enable/preset/clear (C/E/P/C) input. This input is used to control a flip-flop included inside each of the LUs 50, 52, 54, 56. The C/E/P/C input is generated by a C/E/P/C selection circuit 60. The C/E/P/C selection circuit 60 receives inputs EUI[0:4], EBI[0:4], JI[0:7], GI[0:1], and GG[0:7]. From these signals, the C/E/P/C selection circuit 60 selects four signals to be used as the C/E/P/C signals.

Each of the LUs 50, 52, 54, 56 includes three outputs: Y, JPO, and JO. These outputs carry the result of the Boolean functions and logic operations performed by the LU. As already mentioned, the JPO and JO outputs from each of the LUs 50, 52, 54, 56 are grouped together to form the JI[0:7] bus which is fed back into the inputs of the LUs 50, 52, 54, 56. The Y output from each of the LUs 50, 52, 54, 56 are grouped together to form Y[0:3] of the Y[0:4] bus. The Y[4]

signal is selected using a multiplexer (or selection circuit) 62 to select from the JI[0:7] bus. An advantage of selecting the Y[4] signal from the JI[0:7] bus is that it adds flexibility to the device. In other words, the JO or JPO output of any of the LUs 50, 52, 54, 56 can be chosen as the Y[4] signal.

The LINT signal can be selected to be any one of the Y[0:4] signals using a multiplexer 64. The use of the LINT signal adds a tremendous amount of flexibility to the FPGA tile 20 because the LINT signal can be sent to any of the FGs 40 or IGs 42. This is because the LINT signal is routed around the FPGA tile 20 using a routing structure that is separate and independent from that of the Y[0:4] bus. In those situations where one of the signals on the Y[0:4] bus cannot be sent to the desired destination or CPU time needs to be conserved, the multiplexer 64 can be used to select that one of the Y[0:4] signals as the LINT signal in order to send the signal to the desired destination.

Figure 8:
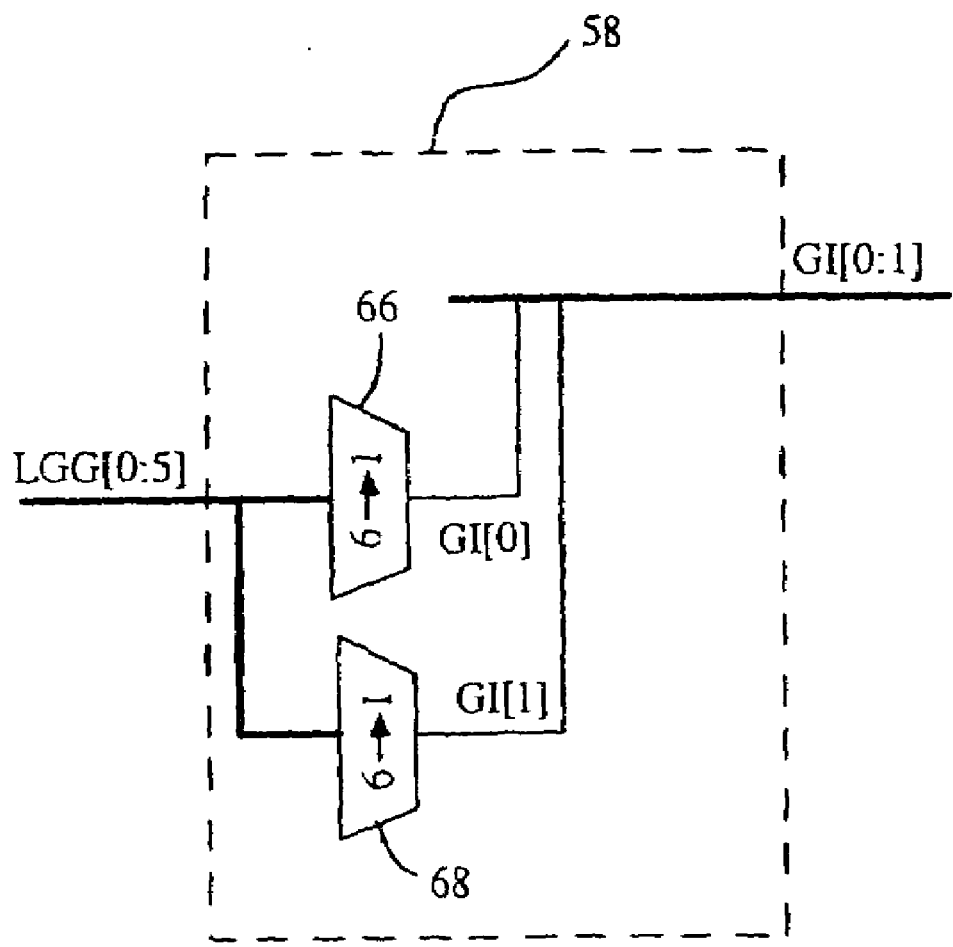
FIG. 8 is a schematic diagram illustrating in further detail the LGG selection circuit shown in FIG. 7.

Referring to FIG. 8, one exemplary version of the LGG selection circuit 58 includes two six-to-one multiplexers 66, 68. Each multiplexer 66, 68 selects one of the input signals LGG[0:5]. The signal selected by multiplexer 66 becomes the signal GI[0], and the signal selected by multiplexer 68 becomes the signal GI[1]. Because the LGG[0:5] bus is supplied to both multiplexers 66, 68, it is possible for the signals GI[0] and GI[1] to be the same signal. As mentioned above, the LGG[0:5] bus is a way for LINT signals from any FG 40 or IG 42 to be sent to any FG 40 or IG 42. The exemplary version of the LGG selection circuit 58 shown can select any two of these LINT signals for sending to the LUs 50, 52, 54, 56 via the GI[0:1] bus. It should be understood, however, that various different designs of the LGG selection circuit 58 may be used to select various different numbers of signals from the LGG[0:5] bus for the LUs 50, 52, 54, 56 in accordance with the present disclosed system.

Figure 9:
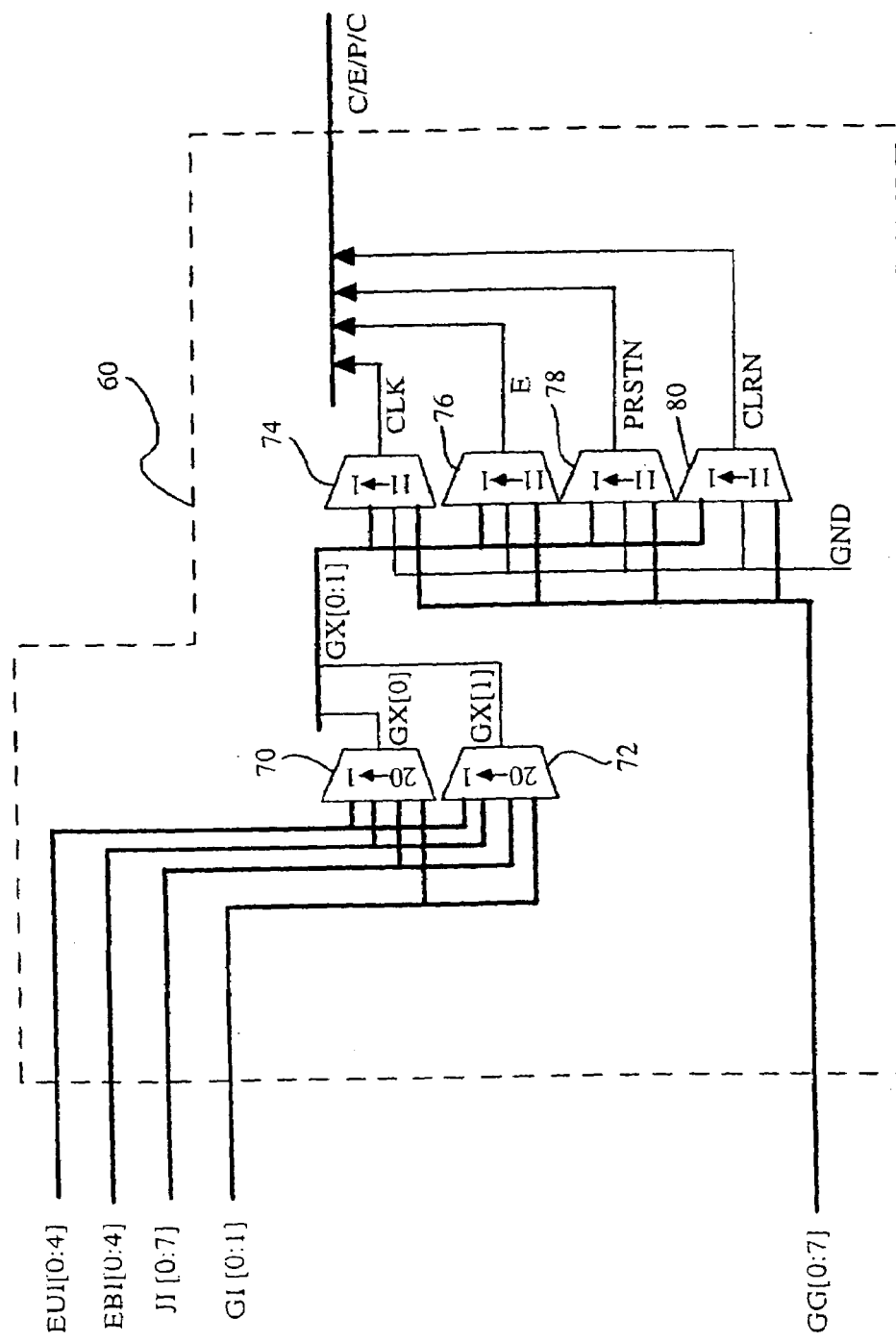
FIG. 9 is a schematic diagram illustrating in further detail the C/E/P/C selection circuit shown in FIG. 7.

Referring to FIG. 9, there is illustrated an exemplary version of the C/E/P/C selection circuit 60. The circuit 60 includes two twenty-to-one multiplexers 70, 72. Each multiplexer 70, 72 selects one signal from the buses EUI[0:4], EBI[0:4], JI[0:7], and GI[0:1]. The signal selected by multiplexer 70 becomes the signal GX[0:], and the signal selected by multiplexer 72 becomes the signal GX[1]. The bus GX[0:1] is supplied to the inputs of four eleven-to-one multiplexers 74, 76, 78, 80. Also supplied to the inputs of the four multiplexers 74, 76, 78, 80 are the GG[0:7] bus and a ground signal. The signal selected by multiplexer 74 becomes the clock signal CLK, the signal selected by multiplexer 76 becomes the enable signal E, the signal selected by multiplexer 78 becomes the preset signal PRSTN, and the signal selected by multiplexer 80 becomes the clear signal CLRN. The use of the four multiplexers 74, 76, 78, 80 allows any of the signals GX[0:1], GG[0:7], and ground to be selected as one of the C/E/P/C signals.

As discussed above, the GG[0:7] bus is an inter-tile global bus that is sent to every FG 40 in all FPGA tiles. The signals in the GG[0:7] bus are often selected as the C/E/P/C signals. In addition, the C/E/P/C selection circuit 60 advantageously allows the two signals GX[0:1] to be selected as the C/E/P/C signals. And the two signals GX[0:1] can be selected from any of the buses EUI[0:4], EBI[0:4], JI[0:7], and GI[0:1]. Therefore, the C/E/P/C selection circuit 60 allows numerous different signals to be selected as the C/E/P/C signals which provides for a very flexible device. It should be well understood, however, that the illustrated C/E/P/C selection circuit 60 is just one exemplary version of such a selection circuit and that various different designs of the C/E/P/C selection circuit 60 may be used to select various different signals in accordance with the present disclosed system.

Figure 10:
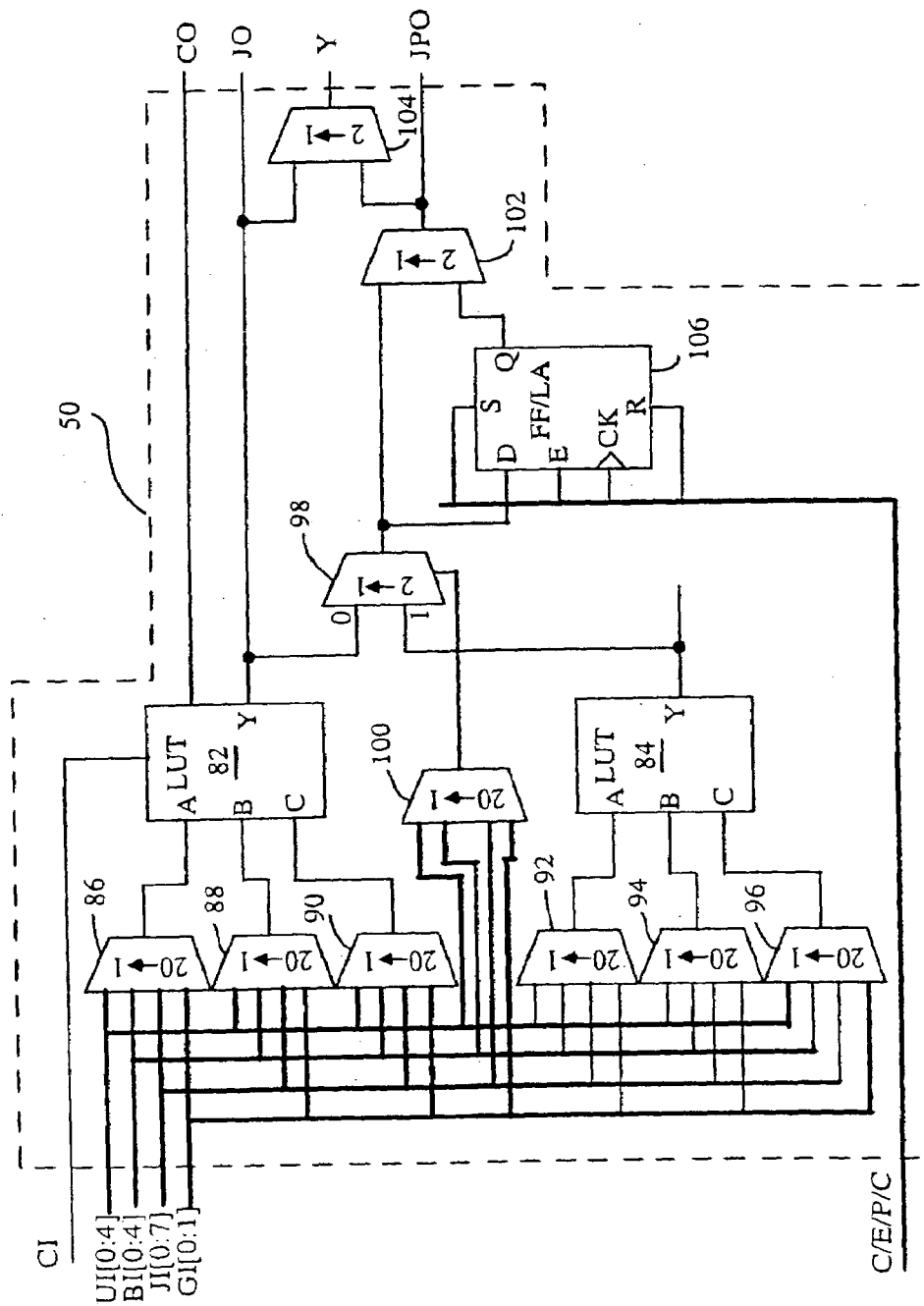
FIG. 10 is a schematic diagram illustrating in further detail one of the logic units (LU) shown in FIG. 7.

Referring to FIG. 10, there is illustrated an exemplary version of the LU 50. The LUs 50, 52, 54, 56 are preferably all of the same design, but it should be understood that such is not required in accordance with the present disclosed system. The LU 50 includes two look-up tables (LUT) 82, 84. Each LUT 82, 84 includes three inputs A, B, C, an output Y, and several internal memory cells (not shown). The LUTs 82, 84 are configured by programming the internal memory cells, and the specific setting of the internal memory cells taken together provides a specific configuration for each of the LUTs 82, 84. The configuration data used to program the internal memory cells is generated by design software. Once a specific configuration of the internal memory cells is decided upon, the inputs A, B, C may be used to generate the output Y in accordance with the desired logic function.

The inputs A, B, C of the LUT 82 are provided by the twenty-to-one multiplexers 86, 88, 90, respectively, and the inputs A, B, C of the LUT 84 are provided by the twenty-to-one multiplexers 92, 94, 96, respectively. Each of the multiplexers 86, 88, 90, 92, 94, 96 receives as inputs the four buses EUI[0:4], EBI[0:4], JI[0:7], and GI[0:1]. Therefore, three signals are selected from these twenty signals as the inputs A, B, C for each of the LUTs 82, 84.

When only a three input LUT is needed, the LUT 82 can be used by itself and the LUT 84 is not needed. The Y output of the LUT 82 can be sent directly to the JO output of the LU 50, or the Y output of the LUT 82 can be sent to the Y output of the LU 50 by using the two-to-one multiplexer 104 to select the Y output of the LUT 82. Additionally, the Y output of the LUT 82 can be sent to the JPO output of the LU 50 by using the two-to-one multiplexer 98 to select the Y output of the LUT 82 and the two-to-one multiplexer 102 to select the output of the multiplexer 98. Thus, the multiplexers 98, 102, 104 can be used to send the Y output of the LUT 82 to any of the outputs Y, JO, JPO of the LU 50.

One purpose of including two LUTs 82, 84 in the LU 50 is so that they can be used together to provide a four-input LUT. Specifically, the Y output of the LUT 82 and the Y output of the LUT 84 are connected to the inputs of the two-to-one multiplexer 98. The multiplexer 98 is controlled by the twenty-to-one multiplexer 100 which receives as its inputs the four buses EUI[0:4], EBI[0:4], JI[0:7], and GI[0:1]. The LUTs 82, 84 both receive the first, second and third inputs at their A, B, C inputs, and the multiplexer 100 is programmed to select the fourth input and provide it to the control input of the multiplexer 98. According to well-known Boolean logic techniques and the Shannon Expansion, connecting the three-input LUTs 82, 84 in this manner will simulate a single four-input LUT with the result being generated at the output of the multiplexer 98. The output of the multiplexer 98 can be provided to the JPO output of the LU 50 by way of the multiplexer 102 or to the Y output of the LU 50 by way of the multiplexers 102, 104.

A flip-flop 106 is preferably also included in the LU 50. Specifically, the D input of the flip-flop 106 is connected to the output of the multiplexer 98, and the Q output of the flip-flop 106 is connected to one of the inputs of the multiplexer 102. The clock, enable, set and reset inputs of the flip-flop 106 are connected to the corresponding signals of the C/E/P/C bus. One purpose of the flip-flop 106 is to store the output data of the multiplexer 98. This data can be stored and later sent to the JPO output of the LU 50 by selecting the Q output with the multiplexer 102. The stored data can also be sent to the Y output of the LU 50 by selecting the JPO signal with the multiplexer 104. The inclusion of the flip-flop 106 in the LU 50 adds to the flexibility of the device in that output data of the LU 50 can be stored and used at a later time.

Figure 11:
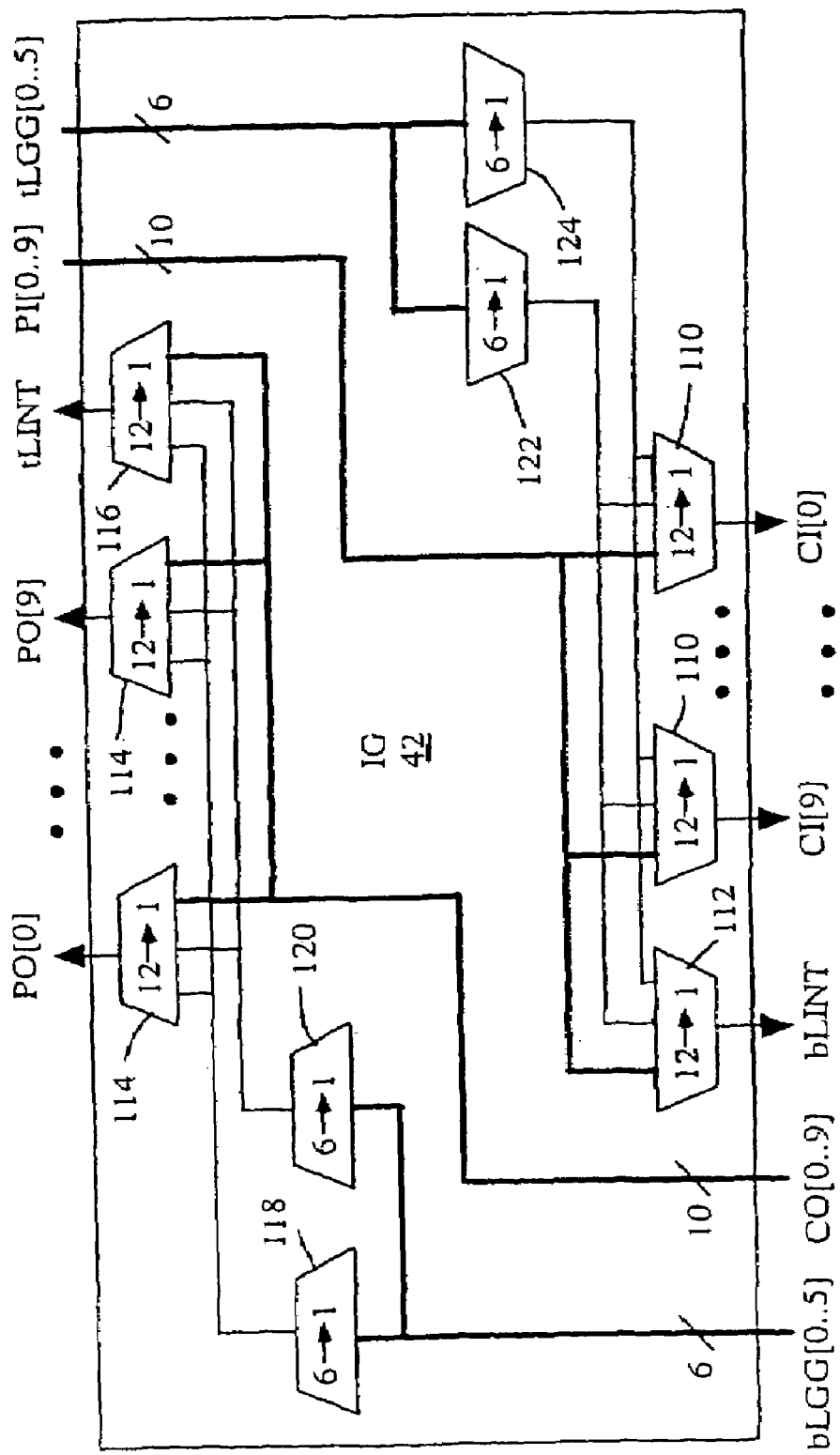
FIG. 11 is a block diagram illustrating in further detail one of the interface groups (IGs) shown in FIG. 5.

Referring to FIG. 11, there is illustrated the internal components of an exemplary version of one of the IGs 42. As mentioned above, the IGs 42 are used for interfacing the FPGA tile 20 to other FPGA tiles or devices, or to pad rings for connecting the FPGA tile 20 to IC package pins. The PI[0:9] bus is used to receive data from outside of the FPGA tile 20 and pass the data to the regular routing structure inside of the FPGA tile 20 via the CI[0:9] bus. The CO[0:9] bus is used to receive data from the regular routing structure inside of the FPGA tile 20 and pass the data to outside of the FPGA tile 20 via the PO[0:9] bus.

Similar to the FG 40, the IG 42 also includes LINT signals and LGG buses. Specifically, for signals coming into the FPGA tile 20, the PI[0:9] bus is coupled to ten, twelve-to-one multiplexers 110 that select the signals which form the CI[0:9] bus. If, however, the regular routing structure that is coupled to the CI[0:9] bus is unable to route a signal to the desired location within the FPGA tile 20, the signal can be selected as the "bLINT" signal by the twelve-to-one multiplexer 112. The bLINT signal is routed by the same secondary routing structure that is used to the route the LINT signals generated by the FGs 40. As such, the bLINT signal can be routed along this secondary routing structure to any of the FGs 40 and/or IGs 42 in the FPGA tile 20. This provides a way to route any of the incoming signals PI[0:9] to any destination within the FPGA tile 20 even if the regular routing structure carrying the CI[0:9] bus does not provide a path to that destination.

Similarly, for signals leaving the FPGA tile 20, the CO[0:9] bus is coupled to ten, twelve-to-one multiplexers 114 that select the signals which form the PO[0:9] bus. If, however, the routing structure that is coupled to the PO[0:9] bus is unable to route a signal to the desired location outside of the FPGA tile 20 (e.g., in a neighboring FPGA tile), the signal can be selected as the "tLINT" signal by the twelve-to-one multiplexer 116. The tLINT signal is routed by a secondary routing structure that is used to route the LINT signals in the neighboring FPGA tile, and as such, the tLINT signal can be routed to any of the FGs and/or IGs in the neighboring FPGA tile. This provides a way to route any of the outgoing signals CO[0:9] to any destination within the neighboring FPGA tile even if the regular routing structure carrying the PO[0:9] bus does not provide a path to that destination.

As mentioned above, the secondary routing structure within the FPGA tile 20 that carries LINT signals includes the LGG[0:5] bus. Specifically, several LINT signals that need to be routed around the FPGA tile 20 are grouped together to form the LGG[0:5] bus. The LGG[0:5] bus is provided to every FG 40 and IG 42 so that LINT signals can be sent to every device. The IGs 42 receive the LGG[0:5] bus from inside of the FPGA tile 20 at input bLGG[0:5]. The bLGG[0:5] input is coupled to the six-to-one multiplexers 118, 120, which have their outputs coupled to the multiplexers 114, 116. In this way, any LINT signal generated within the FPGA tile 20 can be sent outside of the FPGA tile 20 on the PO[0:9] bus or as the tLINT signal by programming the appropriate multiplexers 114, 116 to select the outputs of the appropriate multiplexers 118, 120.

Similarly, an LGG bus in a neighboring FPGA tile can be connected to the tLGG[0:5] input of the IG 42. The tLGG [0:5] input is coupled to the six-to-one multiplexers 122, 124, which have their outputs coupled to the multiplexers 110, 112. In this way, any LINT signal generated outside of the FPGA tile 20 can be sent inside the FPGA tile 20 on the CI[0:9] bus or as the bLINT signal by programming the appropriate multiplexers 110, 112 to select the outputs of the appropriate multiplexers 122, 124.

Figure 12:
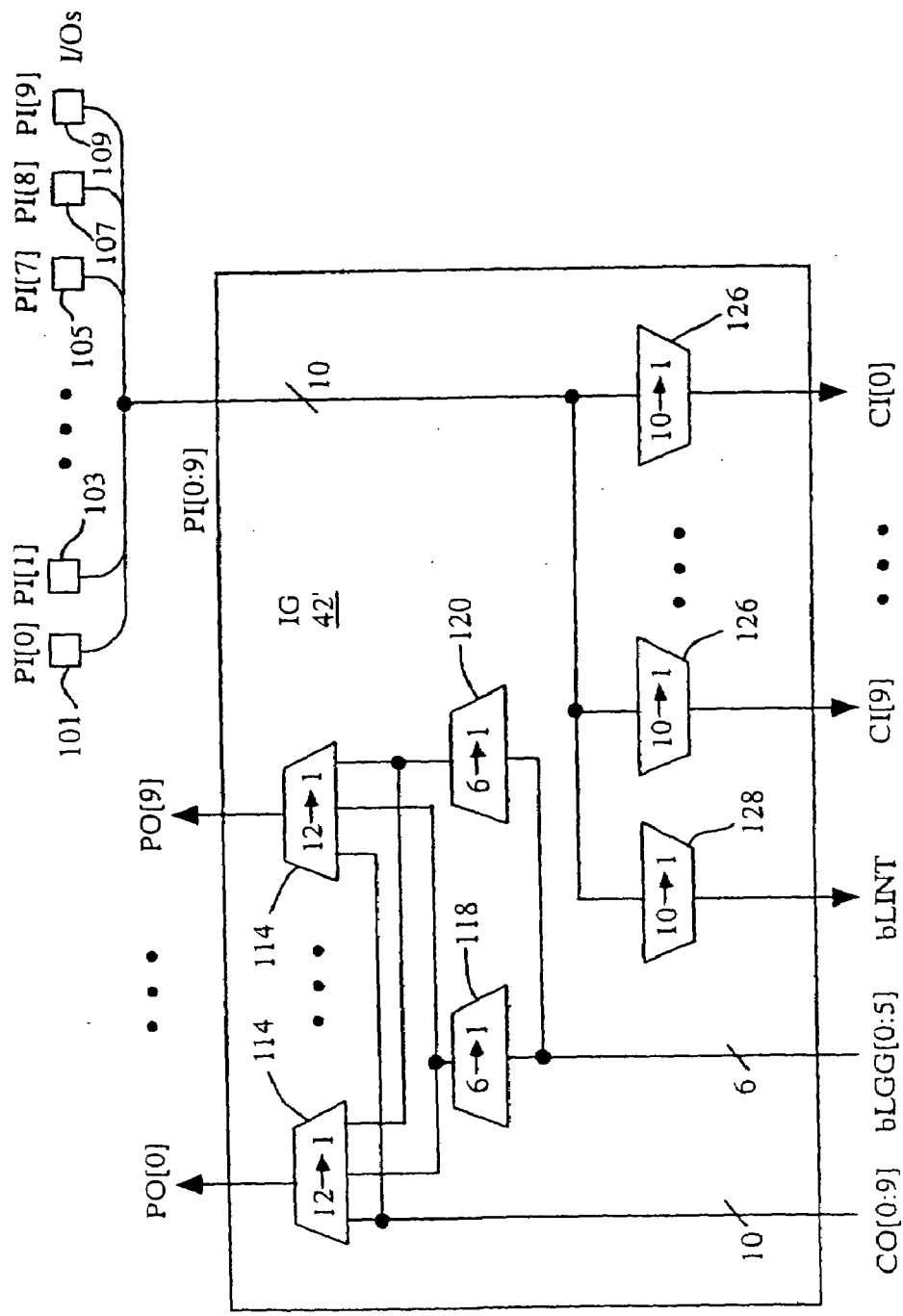
FIG. 12 is a block diagram illustrating in further detail an alternative version of one of the interface groups (IGs) shown in FIG. 5.

It should be understood that in certain situations the tLINT signal and tLGG[0:5] bus may not be needed and can be eliminated from the IG 42 in accordance with the present disclosed system. This is illustrated in FIG. 12 which shows an alternative IG 42' having no tLINT or tLGG[0:5] inputs. An example of a situation where the tLINT signal and tLGG[0:5] bus are not needed is where the IG 42' is used to couple the FPGA tile 20 to a pad ring, such as one of the pad rings 28, 30, 32, 34. In this scenario the PO[0:9] outputs and the PI[0:9] inputs will be coupled through the pad ring to the IC package I/Os (i.e., the IC package input/output pins). This is illustrated in the figure for the PI[0:9] bus in that the PI[0:9] bus is coupled to several I/Os 101, 103, 105, 107, 109. There will typically be no secondary routing structure in the pad rings to make use of the tLINT signal and tLGG[0:5] bus. The multiplexers 116, 122, 124 are eliminated, and the multiplexers 110, 112 are replaced with ten-to-one multiplexers 126, 128.

FIG. 12 also illustrates another important feature of the present disclosed system. Specifically, in the scenario where a side of the FPGA tile 20 is to be coupled to a pad ring for I/O purposes, the I/Os 101, 103, 105, 107, 109 may be directly coupled to the IG 42'. Furthermore, the I/Os 101, 103, 105, 107, 109 may be directly coupled to the multiplexers 126, 128. In other words, the I/Os 101, 103, 105, 107, 109 can be directly coupled to the multiplexers 126, 128 without first connecting to a routing channel. The connection to a routing channel is made after the IG 42' and multiplexers 126, 128. Thus, in this scenario, I/Os are directly coupled to the multiplexers 126, 128 and then go on to the routing channel or other routing resources.

It should also be understood that the IGs of two neighboring FPGA tiles may be combined into one IG in accordance with the present disclosed system. For example, with the IG 42 shown in FIG. 11, the PO[0:9], PI[0:9], tLGG[0:5] buses and the tLINT signal will typically not be coupled to a separate IG of a neighboring tile, but rather, these signals will be coupled into the routing structures of the neighboring FPGA tile and the IG 42 will also serve as the IG of the neighboring tile.

By way of example, any of the multiplexers (selection circuits) discussed herein, such as for example multiplexers 86, 88, 90, 92, 94, 96, 98, 100, 102, 104, may comprise any of the selection circuits described in copending U.S. patent application Ser. No. 09/250,781, filed Feb. 12, 1999, entitled "MULTI-DIMENSIONAL PROGRAMMABLE INPUT SELECTION APPARATUS AND METHOD", invented by Chung-yuan Sun, and commonly assigned herewith, the full disclosure of which is hereby incorporated into the present application by reference.

Figure 13A:
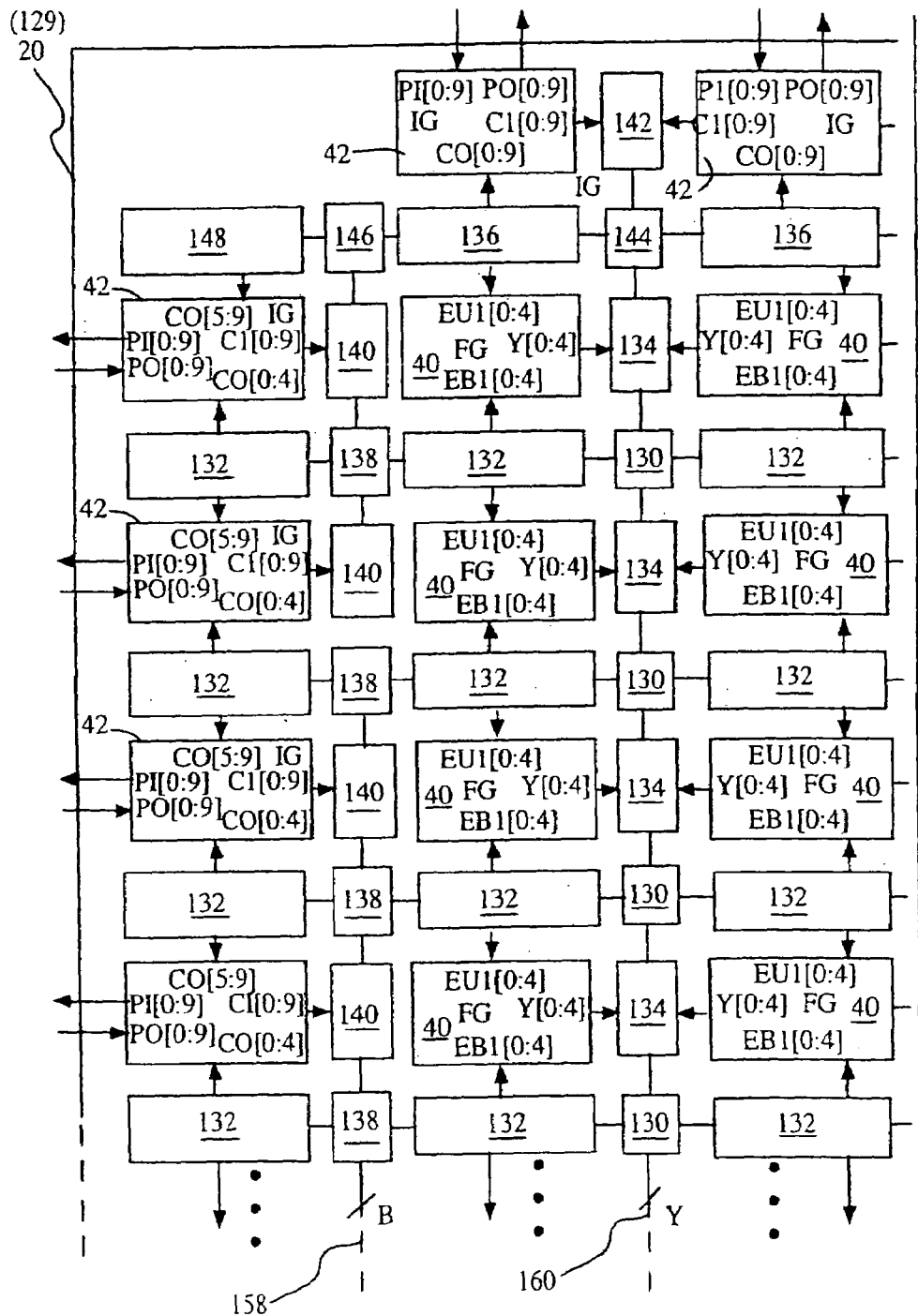
FIG. 13 is a schematic diagram illustrating in further detail a portion of the FPGA tile shown in FIG. 5.
Figure 13B:
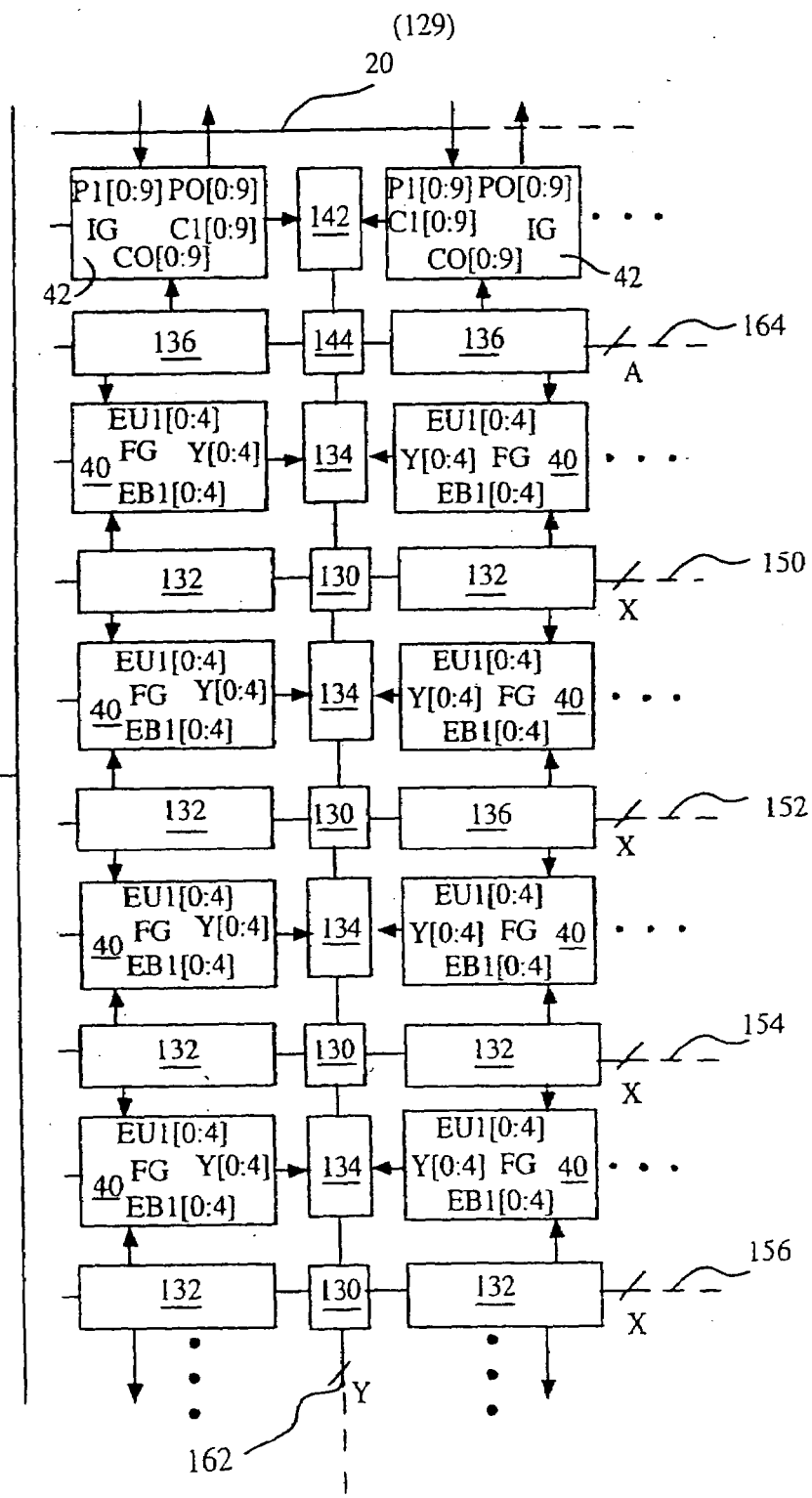

Referring to FIG. 13, there is illustrated a more detailed diagram showing approximately one-quarter of an exemplary version of the FPGA tile 20. The portion of the FPGA tile 20 that is illustrated is designated by 129 in FIG. 5. It will be appreciated by those of ordinary skill in the art that the remaining portions of the FPGA tile 20 are mirror images of the illustrated portion 129.

FIG. 13 illustrates the regular routing structure of the FPGA tile 20 that is used to route the regular routing signals 44 of the FGs 40. As discussed above, the regular routing signals 44 include the input signals EUI[0:4], EBI[0:4], and the output signals Y[0:4]. The regular routing structure of the FPGA tile 20 also handles routing of the CO[0:9] and CI[0:9] buses to and from the IGs 42.

The regular routing structure of the FPGA tile 20 includes several horizontal regular routing buses 150, 152, 154, 156 and several vertical regular routing buses 158, 160, 162. By way of example, the horizontal routing buses 150, 152, 154, 156 may each include X number of lines, the horizontal routing bus 164 may include A number of lines, the vertical routing buses 160, 162 may each include Y number of lines, and the vertical routing bus 158 may include B number of lines. By way of further example, the horizontal routing buses 150, 152, 154, 156 may each include 50 lines, the horizontal routing bus 164 may include 70 lines, the vertical routing buses 160, 162 may each include 60 lines, and the vertical routing bus 158 may include 70 lines.

In order to transfer data from one routing bus to another routing bus or to an FG 40 or an IG 42, several routing interconnect areas 130, 132, 134, 136, 138, 140, 142, 144, 146, 148 are included in the FPGA tile 20. The routing interconnect areas 130, 138, 144, 146 are used to transfer data from one of the vertical routing buses to one of the horizontal routing buses. The other routing interconnect areas 132, 134, 136, 140, 142, 148 are used to transfer data to or from one of the IGs 42 or one of the FGs 40 to or from one of the vertical routing buses or one of the horizontal routing buses. In general, the routing buses and the routing interconnect areas form the regular routing structure of the FPGA tile 20.

Figure 14:
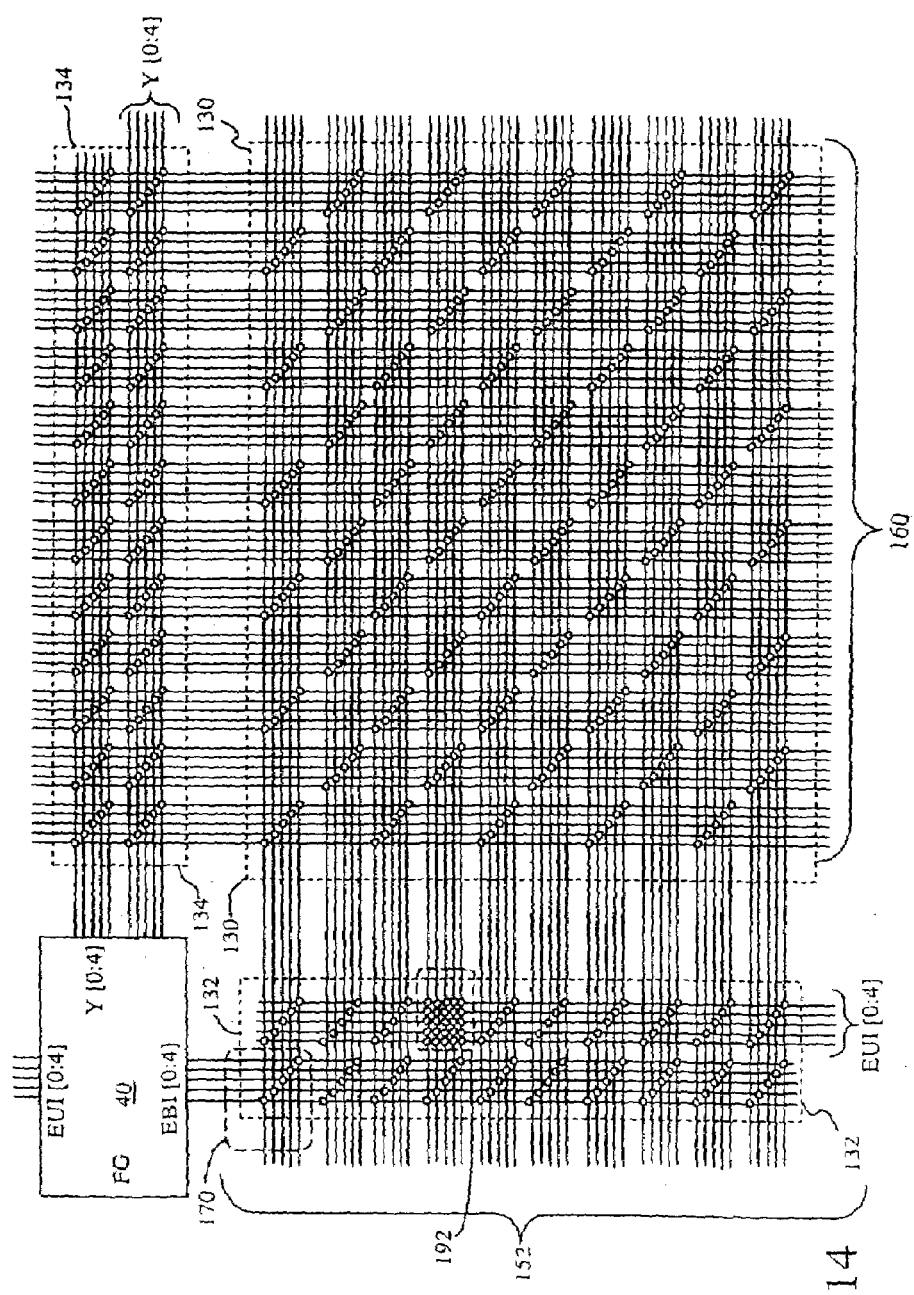
FIG. 14 is a schematic diagram illustrating in further detail a portion of the regular routing structure shown in FIG. 13.

FIG. 14 illustrates an exemplary structure for the routing interconnect areas 130, 132, 134. In this example, the horizontal routing bus 152 includes 50 lines and the vertical routing bus 160 includes 60 lines. It should be well understood, however, that the specific number of lines in any of the routing buses may vary in accordance with the present disclosed system. Furthermore, it should be well understood that the specific number of lines in any of the signal buses, such as for example EUI[0:4], EBI[0:4], Y[0:4], LGG[0:5], GG[0:7], JI[0:7], GI[0:1], CO[0:9], CI[0:9], PO[0:9], PI[0:9], may vary in accordance with the present disclosed system.

Figure 15:
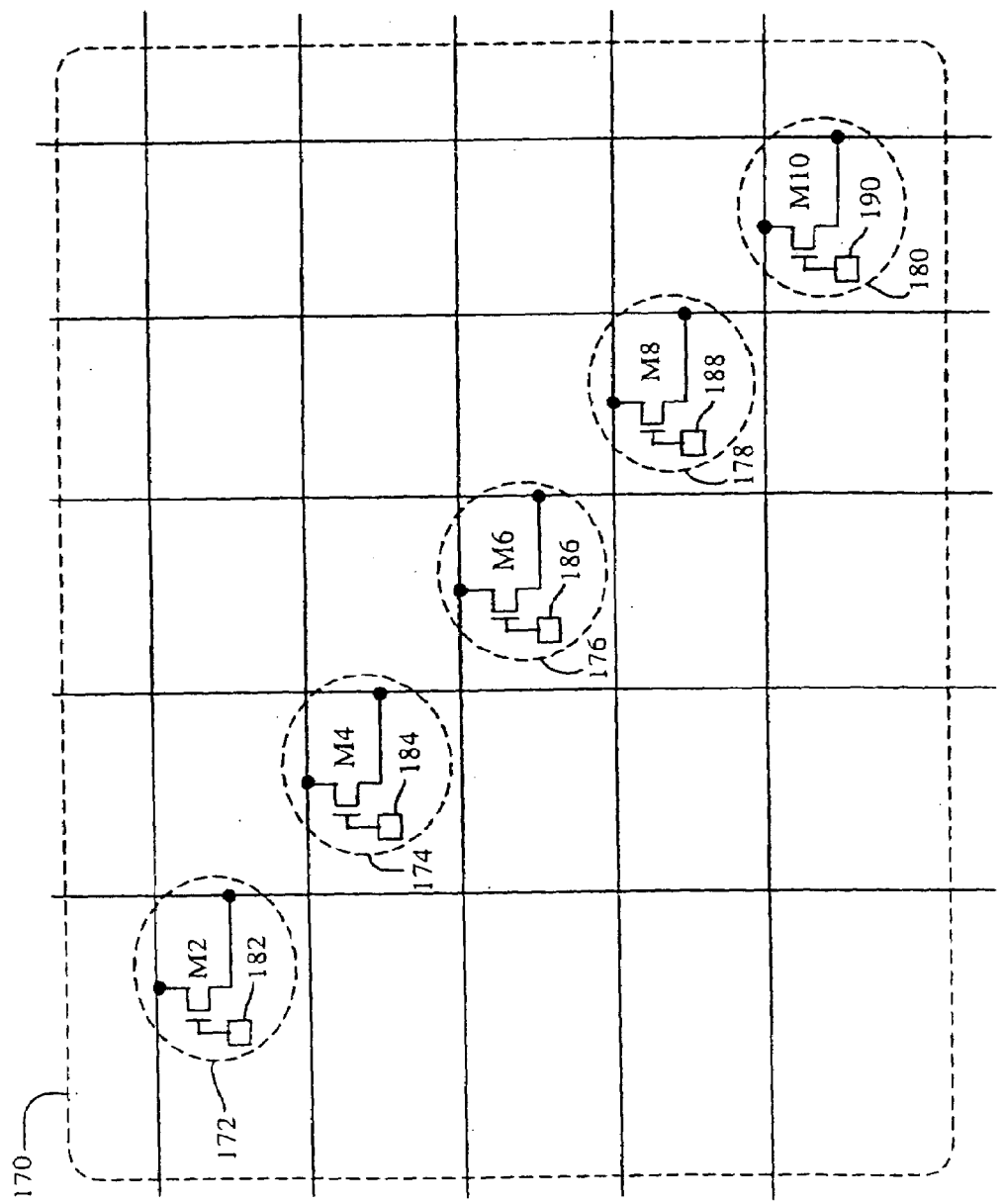
FIG. 15 is a schematic diagram illustrating in further detail a portion of the regular routing structure shown in FIG. 14.

Each of the routing interconnect areas 130, 132, 134 includes several transistor switches and corresponding memory cells which are used for making the connections between the various buses. Each transistor switch and memory cell is illustrated in the figure as a circle (or bubble) drawn at the intersection of signal lines to be coupled together. In order to illustrate this, FIG. 15 shows a detail of the circles designated by 170. The circles 172, 174, 176, 178, 180 includes transistor switches M2, M4, M6, M8, M10, respectively. Each of the transistor switches M2, M4, M6, M8, M10 has its source and drain coupled to intersecting signal lines and its gate coupled to a corresponding memory cell 182, 184, 186, 188, 190. Each of the memory cells stores one bit of configuration data to control whether or not its corresponding transistor switch is turned on or off. When a transistor switch is turned on, the lines to which it is connected are coupled together.

Referring back to FIG. 14, the operation of the routing buses and the routing interconnect areas will be described in further detail. One of the FGs 40 and its nearby routing interconnect areas 130, 132, 134 are illustrated. The Y[0:4] bus of the FG 40 is coupled to the routing interconnect area 134, and the EBI[0:4] bus of the FG 40 is coupled to the routing interconnect area 132. In a typical scenario, the FG 40 outputs data onto the Y[0:4] bus and the routing interconnect area 134 is used to transfer that data onto bus 160. This is done by turning on the transistor switch inside the illustrated circle (or bubble) at the appropriate intersection of signal lines. Each transistor switch is turned on by programming its corresponding memory cell. Similarly, the routing interconnect area 132 is used to transfer data from bus 152 onto the EBI[0:4] bus of the FG 40. Again, this is accomplished by programming the memory cell to turn on the transistor switch at the appropriate intersection. The routing interconnect area 130 is used to transfer data from bus 160 onto bus 152, again by programming the memory cell to turn on the transistor switch at the appropriate intersection.

As illustrated, the routing interconnect areas 130, 132, 134 includes transistor switches and memory cells at many intersections of signal lines, but not at all intersections. (Again, the transistor switches and memory cells are inside the illustrated circles or bubbles). When a transistor switch and memory cell is included at every intersection of signal lines, this is known as a "fully populated" routing interconnect portion. A fully populated routing interconnect portion is shown in the routing interconnect area 132 at 192. It should be well understood that the specific intersections chosen to have a transistor switch and memory cell, and which areas are fully populated (if any), may vary widely in accordance with the present disclosed system. In other words, many different patterns of transistor switches and memory cells may be used in the routing interconnect areas 130, 132, 134 in accordance with the present disclosed system.

The other routing interconnect areas 136, 138, 140, 142, 144, 146, 148 in the FPGA tile 20 are similar to the routing interconnect areas 130, 132, 134. Some, however, will have different numbers of signal lines and intersections. For example, the routing interconnect areas 136, 144 may have a greater number of signal lines in the horizontal bus 164 due in part to ten signals (instead of five) being transferred to the CO[0:9] bus of the IGs 42. Similarly, the routing interconnect areas 146, 148 will have fewer inputs and/or outputs because they are located at the end of a row.

The number of transistor switches used and their positioning in the FPGA tile 20 can change in accordance with the present disclosed system. The specific arrangement and positioning of IGs, FGs, routing buses, routing interconnect areas, and switching transistors within routing interconnect areas will vary greatly depending on the particular application. It should be understood that the configurations illustrated in the figures herein are example configurations.

Figure 16A:
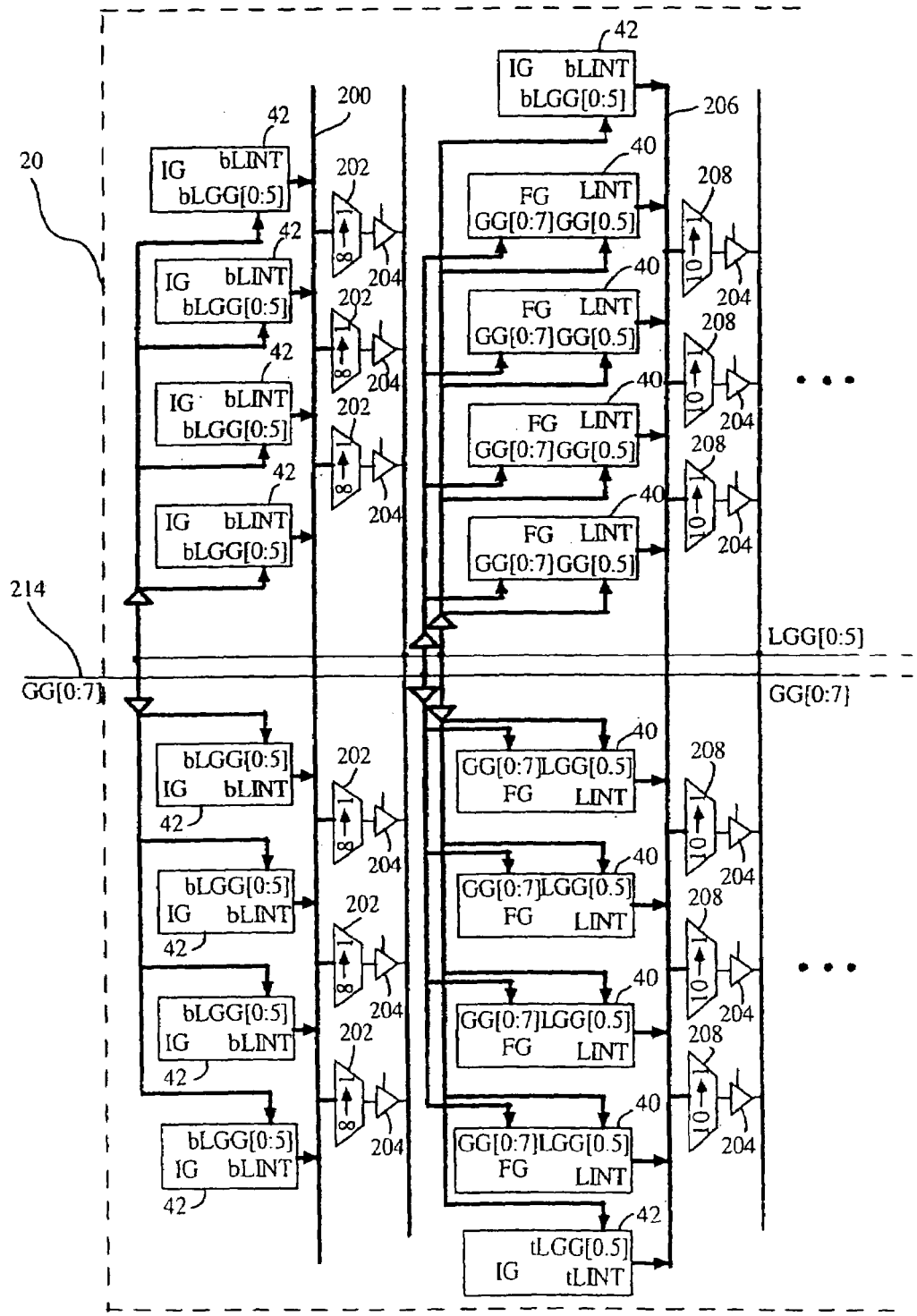
FIGS. 16A and 16B are schematic diagrams illustrating the secondary routing structure included in the FPGA tile shown in FIG. 5.
Figure 16B:
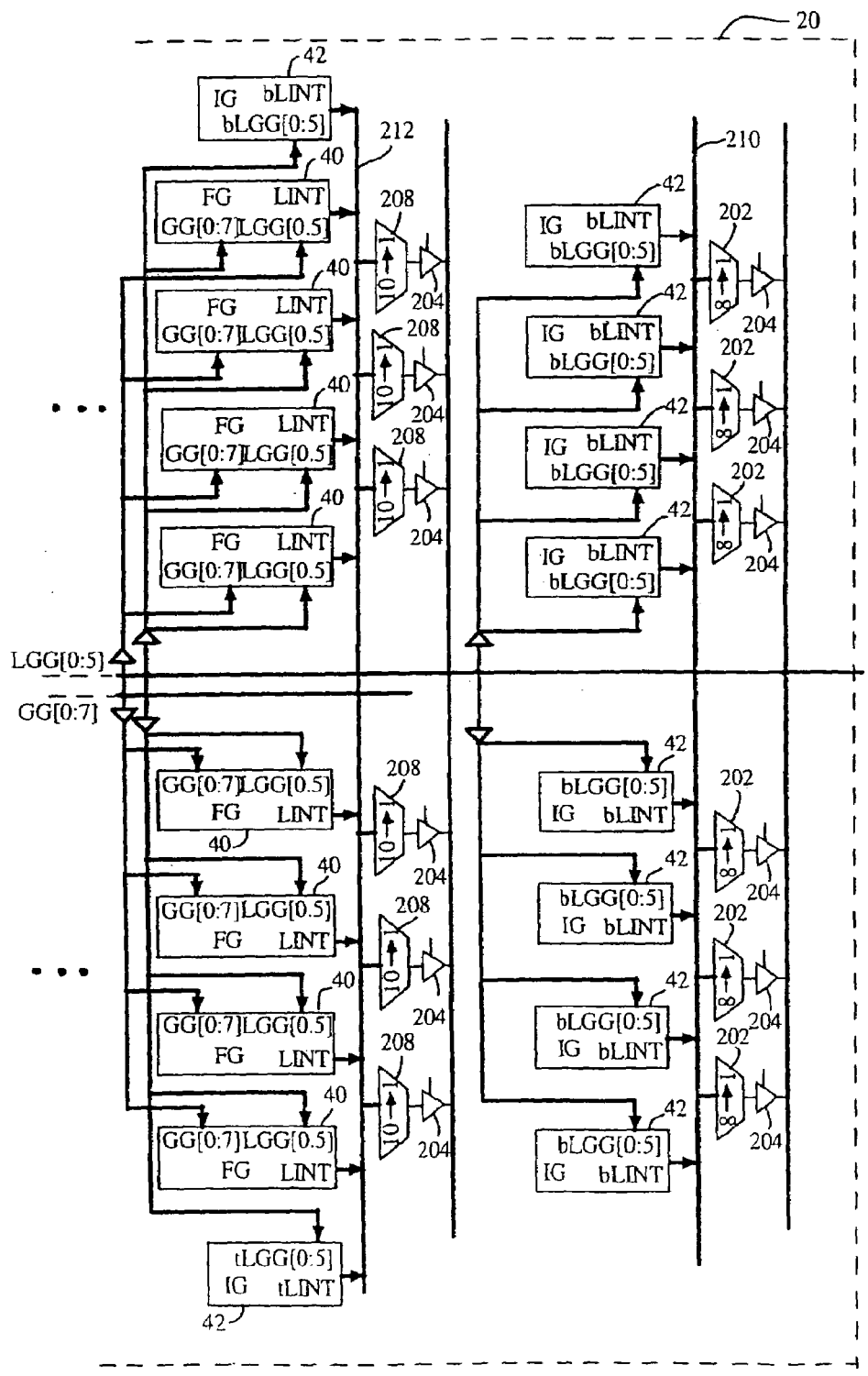

FIGS. 16A and 16B illustrate the secondary routing structure of the FPGA tile 20. As discussed above, the secondary routing structure is separate from the regular routing buses and routing interconnect areas used to route the regular routing output signals Y[0:4]. The secondary routing structure is used for routing the intra-tile global signals 46 which include input signals LGG[0:5] and output signal LINT. The LINT signal is a second routing resource that can be used to send a signal in situations when the regular routing output signals Y[0:4] cannot be used to send a signal to the intended destination. This may occur because a transistor switch and memory cell may not have been placed at the needed intersection of signal lines in one or more of the regular routing interconnect areas 130, 132, 134, 136, 138, 140, 142, 144, 146, 148. If the needed connections cannot be made with the regular routing interconnect areas, the signal can be sent to any of the FGs 40 and/or IGs 42 by selecting the needed one of the regular routing output signals Y[0:4] as the LINT signal as described above and sending it over the secondary routing structure.

The LINT signals of six devices, which can be any combination of FGs 40 and/or IGs 42, are assembled to form the LGG[0:5] bus. While the LGG[0:5] bus is illustrated as a six-signal bus, it should be well understood that the number of signals in the LGG bus may vary in accordance with the present disclosed system. Furthermore, the LGG bus is made up of LINT signals from the FGs 40 and bLINT signals from the IGs 42. As discussed above, the "b" designation on the bLINT signals of the IGs 42 indicates that these signals are internal to the FPGA tile 20 as opposed to the external tLINT signals. Therefore, when discussing the formation of the LGG[0:5] bus, use of the term "LINT" will generally be intended to cover both the LINT signal generated by the FGs 40 and the bLINT signal generated by the IGs 42.

The LGG[0:5] bus is assembled as follows. The first column of IGs 42 has their bLINT outputs coupled to an eight-signal bus 200. Six, eight-to-one multiplexers 202 are coupled to bus 200. The output of each of the multiplexers 202 is coupled to a corresponding tri-state buffer 204. The outputs of the tri-state buffers 204 are coupled to the LGG[0:5] bus. In the second column of FGs 40 and two IGs 42, the LINT output of each FG 40 and the bLINT output of each IG 42 are coupled to a ten-signal bus 206. Six, ten-to-one multiplexers 208 are coupled to bus 206. The output of each of the multiplexers 208 is coupled to a corresponding tri-state buffer 204, which in turn are coupled to the LGG[0:5] bus.

In a similar manner, the last column of IGs 42 has their bLINT outputs coupled to an eight-signal bus 210. Six, eight-to-one multiplexers 202 and tri-state buffers 204 couple bus 210 to the LGG[0:5] bus. In the second to last column of FGs 40 and two IGs 42, the LINT output of each FG 40 and the bLINT output of each IG 42 are coupled to a ten-signal bus 212, which in turn is coupled to the LGG[0:5] bus via six, ten-to-one multiplexers 208 and tri-state buffers 204. It should be understood that the rest of the FGs 40 and IGs 42 in the FPGA tile 20 that are not shown in FIGS. 16A and 16B are connected to the LGG[0:5] bus in a similar manner.

During operation, each of the multiplexers 202, 208 selects a LINT signal from its input bus, that is, the respective one of buses 200, 206, 210, 212. Up to six of these selected LINT signals may be placed onto the LGG[0:5] bus. This is done by placing six of the tri-state buffers 204 into a conducting state and placing the remaining tri-state buffers into a non-conducting state. The six tri-state buffers 204 that are placed into a conducting state should correspond to the multiplexers 202, 208 that have selected the desired LINT signals.

The LGG[0:5] bus is routed to all of the FGs 40 and IGs 42 in the FPGA tile 20. In this way, a LINT signal from any of the FGs 40 and IGs 42 can be sent to any of the FGs 40 and IGs 42, independent of the regular routing structure used for the Y[0:4] bus.

FIGS. 16A and 16B also show the routing of the GG[0:7] bus. As discussed above, the GG[0:7] bus forms the inter-tile global signals 48. These signals are sent to every FG 40 in all FPGA tiles. Thus, the GG[0:7] bus extends through the border of the FPGA tile 20 as indicated at 214 so that it can go to other FPGA tiles. The GG[0:7] bus extends through the border of the FPGA tile 20 without going through an IG 42. As discussed above, selected ones of the input signals GG[0:7] may be used to control the clock/enable/preset/clear (C/E/P/C) inputs of flip-flops included in each FG 40. It should be understood that the GG[0:7] bus may include more or fewer signals in accordance with the present disclosed system.

Figure 17:
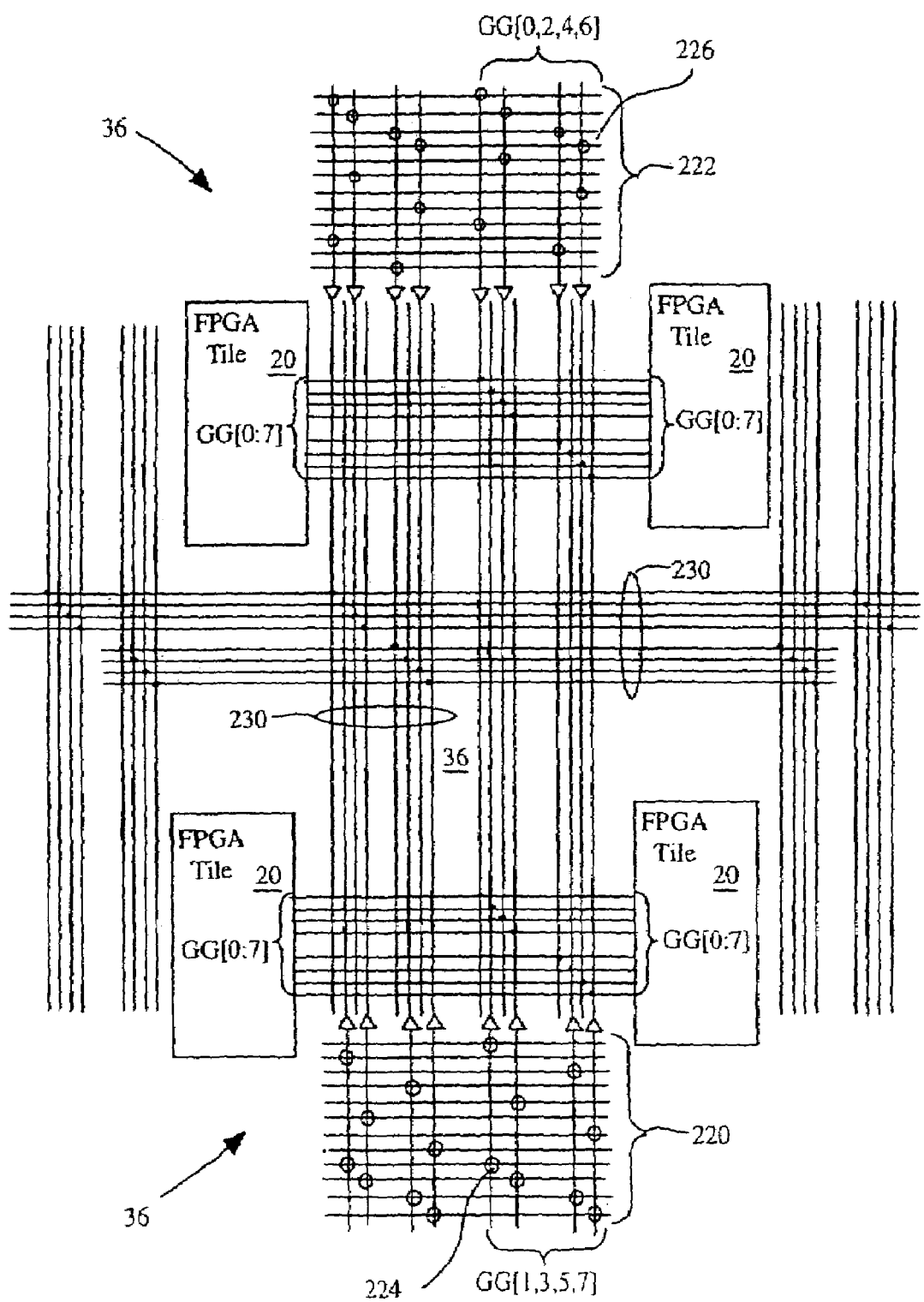
FIG. 17 is a schematic diagram illustrating in further detail the global signal routing structure shown in FIG. 4.

Referring to FIG. 17, the global signal routing structure 36 is illustrated in more detail. As mentioned above, the global signal routing structure 36 is used to route inter-tile global signals between the FPGA tiles 20. For example, the GG[0:7] bus (which forms the inter-tile global signals 48) is included in the global signal routing structure 36 and is shown connecting to all four FPGA tiles 20. Signals that are to be sent on the GG[0:7] bus can be coupled to inputs 220, 222. Selected ones of the inputs 220, 222 can be coupled to selected signals of the GG[0:7] bus by means of transistor switches and memory cells (such as is described above), examples of which are indicated by circles 224, 226.

As shown, the global signal routing structure 36 also includes bus 230 to connect to the pad ring.

Figure 18:
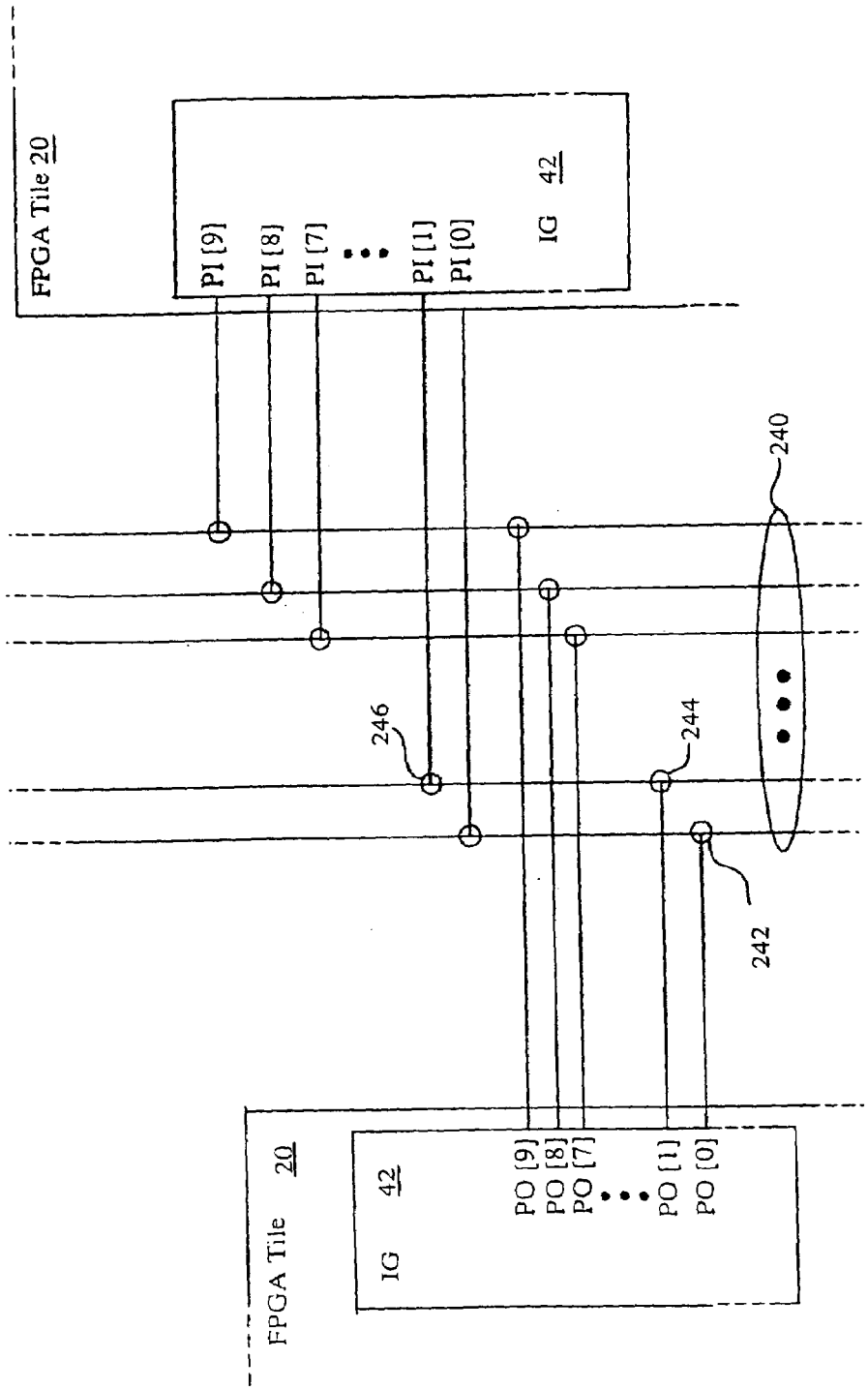
FIG. 18 is a schematic diagram illustrating an optional method of coupling two FPGA tiles together.

When two FPGA tiles 20 are coupled together, the IG outputs of one tile are typically coupled directly to the IG inputs of the other tile. Or, as discussed above, the IGs of the two tiles can be combined as one IG. FIG. 18 illustrates another option for coupling two FPGA tiles 20 together. Specifically, an intermediate routing track 240 may be used. The output PO[0:9] bus of the IG 42 of one tile 20 is coupled to the track 240, and the input PI[0:9] bus of the IG 42 of the other tile 20 is coupled to the track 240 at a different location. The connections to the track 240, for example at points 242, 244, 246, may be by way of hard wired connections for by way of transistor switches and memory cells as described above. The later would, of course, be programmable. It should be understood that the use of the intermediate routing track 240 is optional.

The full disclosures of the following copending U.S. patent applications are hereby incorporated into the present application by reference: U.S. patent application Ser. No. 09/231,998, filed Jan. 15, 1999, now abandoned, entitled "STORAGE CELLS UTILIZING REDUCED PASS GATE VOLTAGES FOR READ AND WRITE OPERATIONS", and commonly assigned herewith; U.S. patent application Ser. No. 09/281,008, filed Mar. 30, 1999, now issued as U.S. Pat. No. 6,301,696 entitled "METHOD AND APPARATUS FOR INCREASING THE SPEED OF FIELD-PROGRAMMABLE GATE ARRAYS", and commonly assigned herewith; U.S. patent application Ser. No. 09/285,563, filed Apr. 2, 1999, now issued as U.S. Pat. No. 6,446,242, entitled "METHOD AND APPARATUS FOR STORING A VALIDATION NUMBER IN A FIELD-PROGRAMMABLE GATE ARRAY", and commonly assigned herewith; and U.S. patent application Ser. No. 09/318,198, filed May 25, 1999, now issued as U.S. Pat. No. 6,211,697 entitled "INTEGRATED CIRCUIT THAT INCLUDES A FIELD-PROGRAMMABLE GATE ARRAY AND A HARD GATE ARRAY HAVING THE SAME UNDERLYING STRUCTURE", and commonly assigned herewith.

In a SRAM based FPGA device, the memory array may be cleared so that the FPGA remains in an inactive state before loading the configuration bit stream. It may be desirable to be clear the configuration memory of an FPGA device and to verify certain conditions of the configuration memory, such as, but not limited to: verifying that the power voltage level of the configuration memory is proper for programming of the configuration memory, verifying that values written to the memory are properly written, and verifying proper memory clearing of the configuration memory.

Figure 19:
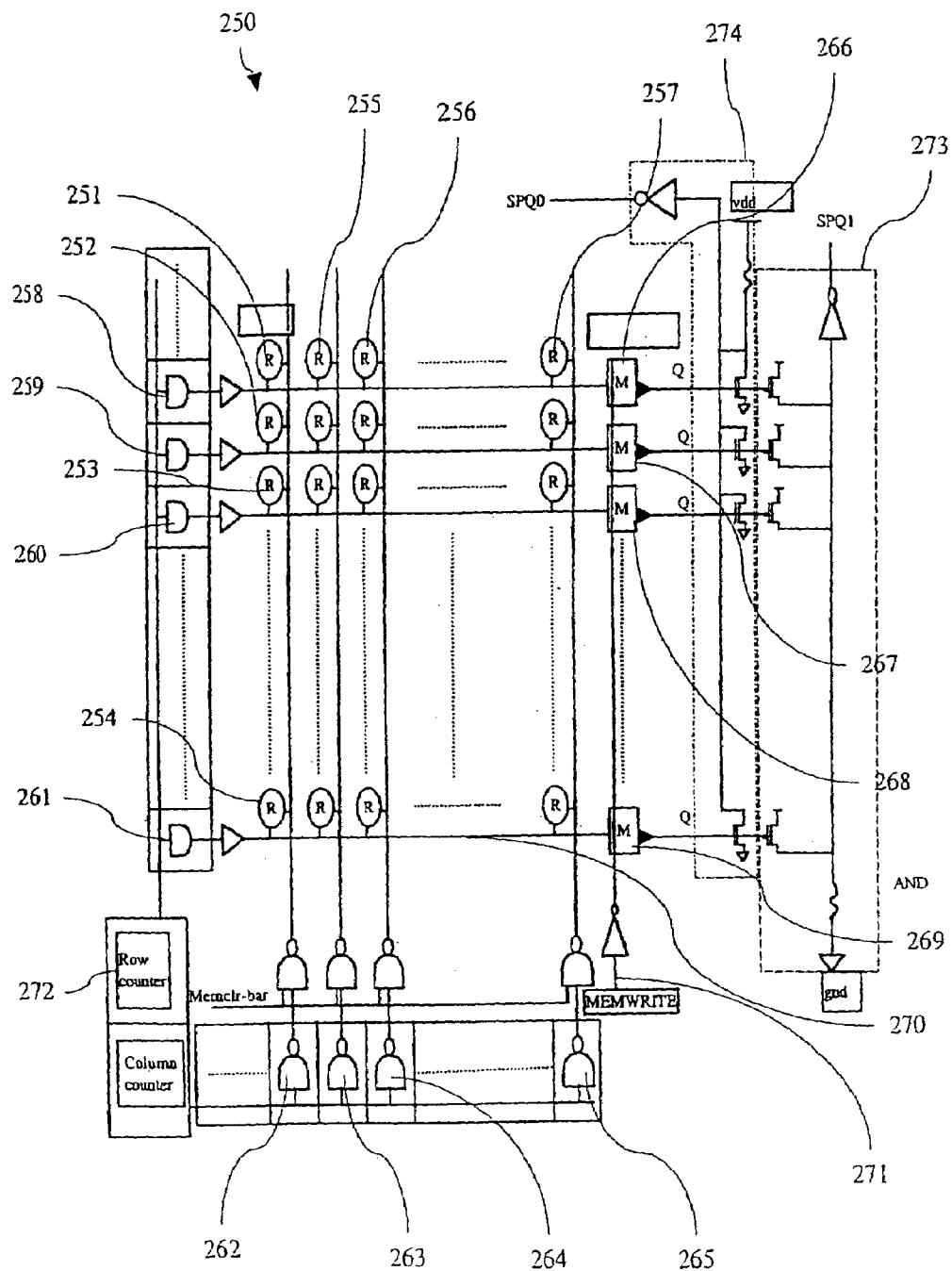
FIG. 19 is a simplified schematic of an FPGA showing a memory array.

Referring to FIG. 19, a simplified schematic of an FPGA device 250 is shown. In a typical FPGA device, the memory array may be arranged in columns and rows of memory cells, thus the cells 251, 252, 253 and 254 indicate a first vertical memory column. Similarly, cells 251, 255, 256 and 257 represent a first horizontal row of memory cells. Each row of the memory array has a row decoder: 258, 259, 260 and 261. Likewise, each column has a column decoder: 262, 263, 264 and 265. In one disclosed embodiment, a column of monitoring memory cells, represented by cells 266, 267, 268 and 269, may be positioned adjacent to the memory array opposite the side where the row decoders are located. This placement of the monitoring memory cells thus requires the row line driver (a typical row line driver is shown at 270) to drive the longest distance to reach the monitoring cells. However, the monitoring cells may be placed at other positions, in one non-limiting example, the memory cells may be placed at the four corners of the memory array. A purpose of these monitoring memory cells is to determine whether they can be successfully cleared and set during the memory clear cycle. If these monitoring memory cells can be cleared and set, then that will indicate that the memory array has been successfully cleared and also indicate that the power condition is proper for bit-stream loading of the FPGA device. The dotted lines in FIG. 19 indicate that more but un-illustrated items such as memory cells, decoders and monitoring memory cells may be present.

Figure 20:
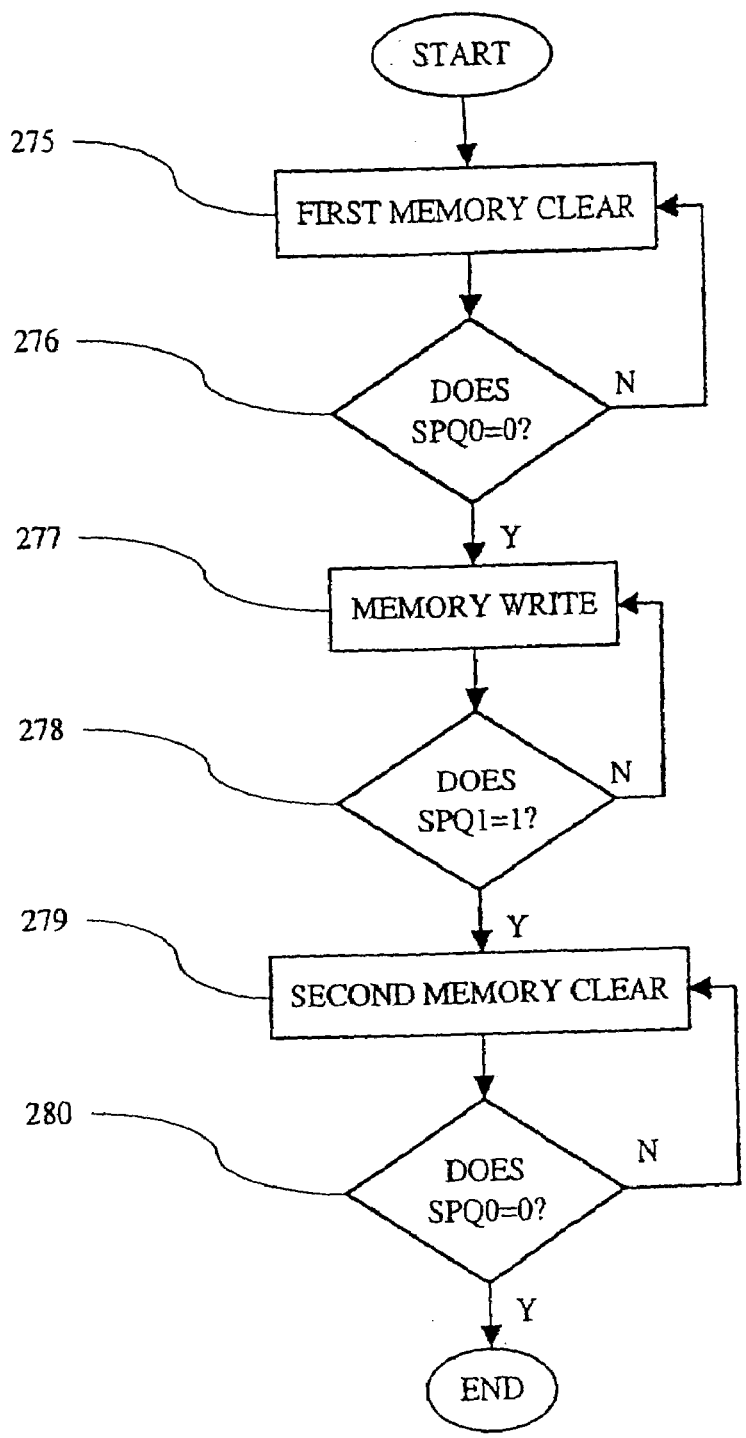
FIG. 20 is a flowchart illustrating one embodiment of the disclosed method.

Each of the monitoring cells will produce a "Q" signal. The "AND" gate formed by the components within the dashed box 273 will verify that all of the Q inputs into it are 1 and therefore output a "SPQ1" signal that is equal to logical 1, thus providing a test to verify that memory write function is working properly on the monitoring memory cells. Similarly, the "OR" gate shown by the components within the dashed-dotted box 274 will verify that all of the Q inputs into it are 0, and therefore output a "SPQ0" signal that is equal to logical 0, thus providing a test to verify that the memory clear function is working properly on the monitoring memory cells. Referring to FIG. 20, a flowchart illustrating one embodiment of the memory array verification method is shown. At act 275, the disclosed method initiates a first memory clear phase, wherein the memory array and the monitoring memory cells are cleared. At query 276, the method determines whether the SPQ0 signal is equal to logical 0. At act 277, the method initiates a memory write phase, where a predetermined value is sent to the monitoring memory cells, in this non-limiting example, the value 1 shall be used. At query 278, the system determines whether the SPQ1 signal is equal to logical 1. At act 279 the system initiates a second memory clear phase, wherein the memory array and the monitoring memory cells are cleared again. At query 280, the system determines whether the SPQ0 signal is equal to logical 0.

During the entire process of each memory clear phases, all the columns of the memory array are active, and all column drivers are driving data-bar lines to clear the memory. For each clock cycle of a memory clear phase, only one row decoder is active, so that for each clock cycle, one row of memory cells are cleared. Referring back to FIG. 19, the row counter 272, controls each row decoder during the memory clear phases. For each phase of the process, the counter will at least count from 0 to full once. That means every row decoder will be active at least once, so that the entire memory array will at least be cleared once during each phase of the process. The monitoring cells are checked when the count is full to see if they have been cleared or written the pre-determined values, if they pass the test (indicated at queries 276, 278 and 280 of FIG. 20), then the respective phase (first memory clear 275, memory write 277 and second memory clear 279 of FIG. 20) ends, otherwise, the counter will count another round and check the monitoring cells when the count is full again. This process will continue until it passes the condition test or when a maximum number of counts are reached. If the maximum number of count is reached then the circuit will issue an error signal.

For example, at the end of each of the first memory clear and second memory clear phases, the SPQ0 signal has to be at 0; while at the end of the Memory Writing phase, SPQ1 has to be 1.

The routing interconnect areas includes transistor switches and memory cells at many intersections of signal lines, but not at all intersections. From this disclosure, it will be apparent to persons of ordinary skill in the art, however, that the specific number of lines in any of the routing buses may vary in accordance with the present disclosed system. Furthermore, it should be well understood that the specific number of lines in any of the signal buses may vary in accordance with the present disclosed system.

It should be understood that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. Circuitry in a field-programmable gate array (FPGA) including an array of random access memory cells comprising at least one row of a plurality of random access memory cells, each of said plurality of random access memory cells is coupled to a row driver line, said circuitry comprising:
   a row decoder coupled to a first end of said row driver line; and
   a monitoring memory cell coupled to said row driver line and a memory writing line.

2. The circuitry of claim 1 wherein said monitoring memory cell is coupled to a second end of said row driver line.

3. The circuitry of claim 1 wherein said monitoring memory cell is coupled to said row driver line at each corner of said array of RAM memory cells.

4. A method for clearing each of a plurality of random access memory cells in an array of random access memory cells in a filed programmable gated array acting as the programming mechanism, wherein said field programmable gated array further having erase circuitry for clearing said array of said random access memory cells for reprogramming of said field programmable gated array and a monitoring memory cell coupled to said erase circuitry and said array of random access memory cells, said method comprising:
   initiating a memory clear phase on said at least one monitoring memory cell;
   reading said monitoring memory cell responsive to said memory clear phase; and
   determining whether the output signal from said monitoring memory cell indicates a cleared monitoring memory cell.

5. The method of claim 4, further comprising:
   performing said memory clear phase a second time responsive to a determination that the output signal from said monitoring memory cell indicates that said monitoring memory cell is not cleared.

6. The method of claim 5, further comprising:
counting a number of times that said memory clear phase is performed;
determining whether said number of times is equal to a threshold; and
generating an alarm responsive to said number of times being greater than said threshold.

7. A method for performing a write function in an array of random access memory cells in a field programmable gated array of a plurality of random access memory cells as a programming mechanism wherein said field programmable gate array includes write circuitry for verifying a write operation that is connected to a monitoring memory cell, the method comprising:
performing said write operation;
reading said monitoring memory cell; and
determining whether the output signal from each said at least one monitoring memory cell indicates a proper write operation performed on said monitoring memory cell.

8. The method of claim 7, further comprising:
performing said memory write a subsequent time responsive to a determination that the output signal from said monitoring memory cell indicates that said monitoring memory cell was not properly written to.

9. The method of claim 8, further comprising:
counting a number of times said memory write is performed;
determining whether said number is at least equal to a threshold; and
generating an alarm if the method returns to said memory write phase more than a predetermined number of times.

10. An apparatus in a field programmable gate array capable of verifying the functioning of an array of a plurality of random memory cells in said filed programmable gate array wherein said filed programmable gate array includes erase circuitry and a monitoring memory cell connected to said erase circuitry, comprising:
means for initiating a memory clear phase on said at least one monitoring memory cell; and
means for determining whether the output signal from each said at least one monitoring memory cell indicates a cleared monitoring memory cell.

11. The apparatus of claim 10, further comprising:
means for performing said memory clear phase a subsequent time responsive to a determination that the output signal from said monitoring memory cell indicates said monitoring memory cell is not cleared.

12. The apparatus of claim 11, further comprising:
means for counting a number of times said memory clear phase is performed;
means for determining whether said number of times is greater than a threshold; and
means for generating an alarm responsive to said counter is greater than said threshold.

13. An apparatus in a field programmable gated array capable of verifying the functioning of an array of a plurality of random access memory cells in said field programmable gate array, wherein said filed programmable gate array includes write circuitry for writing data in said array of said plurality of random access memory cells and a monitoring memory cell coupled to said write circuitry, said apparatus comprising:
means for performing a memory write phase on said monitoring memory cell; and
means for determining whether an output signal from said monitoring memory cell indicates a properly memory written to monitoring memory cell.

14. The apparatus of claim 13, further comprising:
means for performing said memory write phase a subsequent time responsive to a determination that the output signal from at least one monitoring memory cell indicates that said monitoring memory cell was not properly written to.

15. The apparatus of claim 14, further comprising:
means for counting a number of times said memory write phase is performed;
means for determining whether said number of times is greater than a threshold; and
means for generating an alarm responsive to a determination to said memory write phase more than a predetermined number of times.

* * * * *